(12) United States Patent
Yoneda

(10) Patent No.: US 10,295,991 B2
(45) Date of Patent: May 21, 2019

(54) SUBSTRATE PROCESSING APPARATUS AND RECORDING MEDIUM

(71) Applicant: HITACHI KOKUSAI ELECTRIC INC., Tokyo (JP)

(72) Inventor: Akihiko Yoneda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/708,326

(22) Filed: Sep. 19, 2017

(65) Prior Publication Data

US 2018/0024536 A1 Jan. 25, 2018

Related U.S. Application Data

(63) Continuation of application No. PCT/JP2015/060097, filed on Mar. 31, 2015.

(51) Int. Cl.
*G01R 31/26* (2014.01)
*G05B 19/418* (2006.01)
(Continued)

(52) U.S. Cl.
CPC ..... *G05B 19/4183* (2013.01); *G05B 23/0283* (2013.01); *H01L 21/324* (2013.01);
(Continued)

(58) Field of Classification Search
CPC .......... G05B 19/4183; H01L 21/67011; H01L 22/34; H01L 21/324; H01L 22/10; H01L 21/67276; H01L 21/67253; H01L 21/677
(Continued)

(56) References Cited

U.S. PATENT DOCUMENTS

2006/0282189 A1* 12/2006 Akisawa .......... G05B 19/41865
700/110
2007/0030068 A1* 2/2007 Motonobu .............. F16H 61/12
330/257

FOREIGN PATENT DOCUMENTS

JP  S62-238621 A  10/1987
JP  H05-069951 U   9/1993
(Continued)

OTHER PUBLICATIONS

International Search Report for WO 2016/157402 A1, dated Jun. 30, 2015.
(Continued)

*Primary Examiner* — Vu A Vu
(74) *Attorney, Agent, or Firm* — Volpe and Koenig, P.C.

(57) ABSTRACT

A substrate processing apparatus includes a data collection controller and an operation part. The data collection controller is configured to hold monitoring item list information and component management information. Each of the monitoring item list information and the component management information holds; monitoring item information indicative of a monitoring item for monitoring a maintenance component selected as a monitoring target; setting information for setting a threshold value of the maintenance component; monitoring data of the maintenance component; and monitoring information including a number of times of resetting by which the maintenance component is initialized, wherein the component management information is configured to hold the monitoring information for each unit including the maintenance component according to the monitoring item. The operation part provides the data collection controller with the monitoring data from device data collected from the unit.

12 Claims, 24 Drawing Sheets

(51) Int. Cl.
   *H01L 21/324* (2006.01)
   *H01L 21/67* (2006.01)
   *H01L 21/677* (2006.01)
   *H01L 21/66* (2006.01)
   *G05B 23/02* (2006.01)

(52) U.S. Cl.
   CPC ...... *H01L 21/677* (2013.01); *H01L 21/67011* (2013.01); *H01L 21/67253* (2013.01); *H01L 21/67276* (2013.01); *H01L 22/10* (2013.01); *H01L 22/34* (2013.01)

(58) Field of Classification Search
   USPC .......................................................... 438/14
   See application file for complete search history.

(56) References Cited

FOREIGN PATENT DOCUMENTS

| | | |
|---|---|---|
| JP | H07-142391 A | 6/1995 |
| JP | H08-037156 A | 2/1996 |
| JP | 2006-343952 A | 12/2006 |
| JP | 2011-243677 A | 12/2011 |
| KR | 10-2010-0054564 A | 5/2010 |

OTHER PUBLICATIONS

Korean Office Action dated Jan. 4, 2019 for the Korean Patent Application No. 10-2017-7025936.

* cited by examiner

FIG. 5

| No. | Category | Meaning | Classification | Description |
|---|---|---|---|---|
| 1 | Consumable Parts | Consumable component that can be exchanged by consumer | Consumable component | Preventive maintenance component whose average lifetime and failure mode are known or can be predicted during normal operation of device |
| 2 | PM Parts (Preventive Maintenance Parts) | Consumable component to be exchanged by device maker engineer | Consumable component | Preventive maintenance component whose average lifetime and failure mode are known or can be predicted during normal operation of device |
| 3 | Non-Consumable Parts | Exchange component with indefinite exchange cycle, lifetime and the like | Non-consumable component | Component that cannot be predicted for average lifetime and is not periodically exchange but can be exchanged as post-maintenance at the time of device failure |

FIG. 8

| No | Monitoring item | Unit | Setting information | | Monitor information | |
|---|---|---|---|---|---|---|
| | | | Alert | Alarm | Monitoring information | Number of times of reset |
| Furnace Unit | | | | | | |
| 1 | Heater ON time | H | 0 | 0 | 0 | 0 |
| 2 | Heater heating time (operation time in temperature range) | H | 0 | 0 | 0 | 0 |
| Drive Mechanisms Unit | | | | | | |
| 1 | Number of times of front shutter ON | Number of times | 0 | 0 | 0 | 0 |
| 2 | Number of times of FOUP stage ON | Number of times | 0 | 0 | 0 | 0 |
| 3 | Number of times FOUP open | Number of times | 100000 | 150000 | 120000 | 0 |
| 4 | The number of times of mapping | Number of times | 0 | 0 | 0 | 0 |
| 5 | (CZ axis) moving distance | m | 0 | 0 | 0 | 0 |
| 6 | (CS axis) moving distance | m | 0 | 0 | 0 | 0 |
| 7 | (CX axis) moving distance | m | 0 | 0 | 0 | 0 |
| 8 | (CR axis) moving distance | m | 0 | 0 | 0 | 0 |
| 9 | (Z axis) moving distance | m | 0 | 0 | 0 | 0 |
| 10 | (Y axis) moving distance | m | 0 | 0 | 0 | 0 |
| 11 | (X axis) moving distance | m | 0 | 0 | 0 | 0 |
| 12 | (V axis) moving distance | m | 0 | 0 | 0 | 0 |
| 13 | (E axis) moving distance | m | 0 | 0 | 0 | 0 |
| 14 | (R axis) moving distance | m | 0 | 0 | 0 | 0 |
| 15 | Number of times of furnace opening shutter ON | Number of times | 0 | 0 | 0 | 0 |
| Gas System Unit | | | | | | |
| 1 | Number of times of AV open | Number of times | 0 | 0 | 0 | 0 |
| 2 | MFC integrated flow rate | L | 0 | 0 | 0 | 0 |
| Exhaust System Unit | | | | | | |
| 1 | Number of times of main valve open | Number of times | 0 | 0 | 0 | 0 |
| 2 | PUMP ON time | H | 0 | 0 | 0 | 0 |
| Equipment Unit | | | | | | |
| 1 | Film formation time | H | 0 | 0 | 0 | 0 |
| 2 | Number of times of film formation | Number of times | 0 | 0 | 0 | 0 |
| 3 | Accumulative film thickness | nm | 0 | 0 | 0 | 0 |
| 4 | Device power ON time | H | 0 | 0 | 0 | 0 |
| 5 | Device elapsed time | H | 0 | 0 | 0 | 0 |

FIG. 9A

Component PM management

| No. | Unit | Details | Heater ON time | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

Heater temperature history management

| No. | Unit | Details | Temperature monitor information(0~200°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(200~400°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(400~600°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(600~800°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(800~900°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(900~1000°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(1000~1100°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(1100~1200°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(1200~1300°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

| No. | Unit | Details | Temperature monitor information(1300~1400°C) | | | | Unit |
|---|---|---|---|---|---|---|---|
| | | | Setting information | | Monitor information | | |
| | | | Alert | Alarm | Monitor value | Number of times of reset | |
| 1 | T/C | T/C for Heater Control | 0 | 0 | 0 | 0 | H |
| 2 | | T/C for Over temperature Protection | 0 | 0 | 0 | 0 | H |
| 3 | | T/C for Cascade Control | 0 | 0 | 0 | 0 | H |

FIG. 9B

| No. | Unit | Details | Number of times of ON ||||| Device power ON time |||||
|---|---|---|---|---|---|---|---|---|---|---|---|---|
| | | | Setting information || Monitor information ||| Setting information || Monitor information |||
| | | | Alert | Alarm | Monitor value | Number of times of reset | Unit | Alert | Alarm | Monitor value | Number of times of reset | Unit |
| 1 | I/O Shutter | I/O Shutter | 0 | 0 | 0 | 0 | Number of times | 0 | 0 | 0 | 0 | H |
| 2 | AGV/PGV Stage | AGV/PGV Stage | 0 | 0 | 0 | 0 | Number of times | 0 | 0 | 0 | 0 | H |
| 3 | FOUP Opener | FOUP Opener | 0 | 0 | 0 | 0 | Number of times | 0 | 0 | 0 | 0 | H |
| 4 | Wafer Detection | Wafer Detection | 0 | 0 | 0 | 0 | Number of times | 0 | 0 | 0 | 0 | H |
| 5 | Furnace Port Shutter | Furnace Port Shutter | 0 | 0 | 0 | 0 | Number of times | 0 | 0 | 0 | 0 | H |

| No. | Unit | Details | Moving distance ||||| Device power ON time |||||
|---|---|---|---|---|---|---|---|---|---|---|---|---|
| | | | Setting information || Monitor information ||| Setting information || Monitor information |||
| | | | Alert | Alarm | Monitor value | Number of times of reset | Unit | Alert | Alarm | Monitor value | Number of times of reset | Unit |
| 6 | FOUP Loader | CZ AXIS | 0 | 0 | 0 | 0 | m | 0 | 0 | 0 | 0 | H |
| 7 | | CS AXIS | 0 | 0 | 0 | 0 | m | 0 | 0 | 0 | 0 | H |
| 8 | | CX AXIS | 0 | 0 | 0 | 0 | m | 0 | 0 | 0 | 0 | H |
| 9 | Rotation FOUP Storage | CR AXIS | 0 | 0 | 0 | 0 | m | 0 | 0 | 0 | 0 | H |
| 10 | Wafer Transfer | Z AXIS | 0 | 0 | 0 | 0 | m | 0 | 0 | 0 | 0 | H |
| 11 | | Y AXIS | 0 | 0 | 0 | 0 | m | 0 | 0 | 0 | 0 | H |
| 12 | | X AXIS | 0 | 0 | 0 | 0 | m | 0 | 0 | 0 | 0 | H |
| 13 | | V AXIS | 0 | 0 | 0 | 0 | m | 0 | 0 | 0 | 0 | H |
| 14 | Boat Elevator | E AXIS | 0 | 0 | 0 | 0 | m | 0 | 0 | 0 | 0 | H |
| 15 | Boat Rotation | R AXIS | 0 | 0 | 0 | 0 | m | 0 | 0 | 0 | 0 | H |

FIG. 9C

| No. | Unit | Details | MFC integrated flow rate | | | | | | Device power ON time | | | | | |
|---|---|---|---|---|---|---|---|---|---|---|---|---|---|---|
| | | | Setting information | | Monitor information | | | Unit | Setting information | | Monitor information | | | Unit |
| | | | Alert | Alarm | Monitor value | Number of times of reset | | | Alert | Alarm | Monitor value | Number of times of reset | | |
| 1 | MFC | MFC6 | 0 | 0 | 0 | 0 | | L | 0 | 0 | 0 | 0 | | H |
| 1 | | MFC7 | 0 | 0 | 0 | 0 | | L | 0 | 0 | 0 | 0 | | H |
| 1 | | MFC8 | 0 | 0 | 0 | 0 | | L | 0 | 0 | 0 | 0 | | H |

| No. | Unit | Details | MFC integrated flow rate | | | | | | Device power ON time | | | | | |
|---|---|---|---|---|---|---|---|---|---|---|---|---|---|---|
| | | | Setting information | | Monitor information | | | Unit | Setting information | | Monitor information | | | Unit |
| | | | Alert | Alarm | Monitor value | Number of times of reset | | | Alert | Alarm | Monitor value | Number of times of reset | | |
| 4 | AV | AV3 | 0 | 0 | 0 | 0 | | Number of times | 0 | 0 | 0 | 0 | | H |
| 5 | | AV4 | 0 | 0 | 0 | 0 | | Number of times | 0 | 0 | 0 | 0 | | H |
| 6 | | AV13 | 0 | 0 | 0 | 0 | | Number of times | 0 | 0 | 0 | 0 | | H |

FIG. 9D

PM integrated film thickness

| No. | Unit | Details | Setting information | | Monitor information | | |
|---|---|---|---|---|---|---|---|
| | | | Alert | Alarm | Monitor value | Number of times of reset | Unit |
| 1 | Pump | DP | 0 | 0 | 0 | 0 | nm |
| 2 | | MBP | 0 | 0 | 0 | 0 | nm |

Number of times of AV open

| No. | Unit | Details | Setting information | | Monitor information | | |
|---|---|---|---|---|---|---|---|
| | | | Alert | Alarm | Monitor value | Number of times of reset | Unit |
| 4 | APC Valve Unit | AV71 | 0 | 0 | 0 | 0 | Number of times |
| 5 | AV | AV82 | 0 | 0 | 0 | 0 | Number of times |
| 6 | AV | AV83 | 0 | 0 | 0 | 0 | Number of times |

PUMP ON time

| No. | Unit | Details | Setting information | | Monitor information | | |
|---|---|---|---|---|---|---|---|
| | | | Alert | Alarm | Monitor value | Number of times of reset | Unit |
| 1 | Pump | DP | 0 | 0 | 0 | 0 | H |
| 2 | | MBP | 0 | 0 | 0 | 0 | H |

Device power ON time

| No. | Unit | Details | Setting information | | Monitor information | | |
|---|---|---|---|---|---|---|---|
| | | | Alert | Alarm | Monitor value | Number of times of reset | Unit |
| 4 | APC Valve Unit | AV71 | 0 | 0 | 0 | 0 | H |
| 5 | AV | AV82 | 0 | 0 | 0 | 0 | H |
| 6 | AV | AV83 | 0 | 0 | 0 | 0 | H |

FIG. 9E

Device power ON time

| No. | Unit | Details | Setting information | | Monitor information | | |
|---|---|---|---|---|---|---|---|
| | | | Alert | Alarm | Monitor value | Number of times of reset | Unit |
| 1 | Operation Controller | OPERATION UNIT | 0 | 0 | 0 | 0 | H |
| 2 | Transfer Controller | TRANSFER MODULE | 0 | 0 | 0 | 0 | H |
| 3 | | MOTION CONTROL MODULE | 0 | 0 | 0 | 0 | H |
| 4 | Process Controller | PROCESS MODULE | 0 | 0 | 0 | 0 | H |

FIG. 9F

| No. | Unit | Details | Setting information | | Monitor information | | Unit |
|---|---|---|---|---|---|---|---|
| | | | Alert | Alarm | Monitor value | Number of times of reset | |
| | | | | | | | Device elapsed time |
| 1 | Clean Unit Filter | Wafer transfer area (Transfer) | 0 | 0 | 0 | 0 | H |
| 2 | | Wafer transfer area (Loading Area) | 0 | 0 | 0 | 0 | H |
| 3 | | Rotation FOUP Storage (Lower) | 0 | 0 | 0 | 0 | H |
| 4 | | Rotation FOUP Storage (Upper) | 0 | 0 | 0 | 0 | H |

FIG. 9G

| Component PM management | | | | | | | | | | | |
|---|---|---|---|---|---|---|---|---|---|---|---|
| | | | PM accumulative film thickness | | | | | Device power ON time | | | |
| No. | Unit | Details | Setting information | | Monitor information | | Unit | Setting information | | Monitor information | | Unit |
| | | | Alert | Alarm | Monitor value | Number of times of reset | | Alert | Alarm | Monitor value | Number of times of reset | |
| 1 | QUARTZ | QUARTZ BOTA | 0 | 0 | 0 | 0 | nm | 0 | 0 | 0 | 0 | H |
| 2 | | QUARTZ REACTOR TUBE | 0 | 0 | 0 | 0 | nm | 0 | 0 | 0 | 0 | H |
| 3 | | QUARTZ ADIABATIC PLATE | 0 | 0 | 0 | 0 | nm | 0 | 0 | 0 | 0 | H |
| 4 | | QUARTZ NOZZLE | 0 | 0 | 0 | 0 | nm | 0 | 0 | 0 | 0 | H |
| 5 | | QUARTZ BOAT FIXING RING | 0 | 0 | 0 | 0 | nm | 0 | 0 | 0 | 0 | H |
| 6 | | QUARTZ SEAL CAP PLATE | 0 | 0 | 0 | 0 | nm | 0 | 0 | 0 | 0 | H |

| Heater temperature history management | | | | | | | | | | | |
|---|---|---|---|---|---|---|---|---|---|---|---|
| | | | Temperature monitor information (0~200°C) | | | | | Temperature monitor information (200~400°C) | | | |
| No. | Unit | Details | Setting information | | Monitor information | | Unit | Setting information | | Monitor information | | Unit |
| | | | Alert | Alarm | Monitor value | Number of times of reset | | Alert | Alarm | Monitor value | Number of times of reset | |
| 1 | QUARTZ | QUARTZ BOTA | 0 | 0 | 0 | 0 | nm | 0 | 0 | 0 | 0 | H |
| 2 | | QUARTZ REACTOR TUBE | 0 | 0 | 0 | 0 | nm | 0 | 0 | 0 | 0 | H |
| 3 | | QUARTZ ADIABATIC PLATE | 0 | 0 | 0 | 0 | nm | 0 | 0 | 0 | 0 | H |
| 4 | | QUARTZ NOZZLE | 0 | 0 | 0 | 0 | nm | 0 | 0 | 0 | 0 | H |
| 5 | | QUARTZ BOAT FIXING RING | 0 | 0 | 0 | 0 | nm | 0 | 0 | 0 | 0 | H |
| 6 | | QUARTZ SEAL CAP PLATE | 0 | 0 | 0 | 0 | nm | 0 | 0 | 0 | 0 | H |
| | | | Temperature monitor information (400~600°C) | | | | | Temperature monitor information (600~800°C) | | | |
| No. | Unit | Details | Setting information | | Monitor information | | Unit | Setting information | | Monitor information | | Unit |
| | | | Alert | Alarm | Monitor value | Number of times of reset | | Alert | Alarm | Monitor value | Number of times of reset | |
| 1 | QUARTZ | QUARTZ BOTA | 0 | 0 | 0 | 0 | nm | 0 | 0 | 0 | 0 | H |
| 2 | | QUARTZ REACTOR TUBE | 0 | 0 | 0 | 0 | nm | 0 | 0 | 0 | 0 | H |
| 3 | | QUARTZ ADIABATIC PLATE | 0 | 0 | 0 | 0 | nm | 0 | 0 | 0 | 0 | H |
| 4 | | QUARTZ NOZZLE | 0 | 0 | 0 | 0 | nm | 0 | 0 | 0 | 0 | H |
| 5 | | QUARTZ BOAT FIXING RING | 0 | 0 | 0 | 0 | nm | 0 | 0 | 0 | 0 | H |
| 6 | | QUARTZ SEAL CAP PLATE | 0 | 0 | 0 | 0 | nm | 0 | 0 | 0 | 0 | H |
| | | | Temperature monitor information (800~900°C) | | | | | Temperature monitor information (900~1000°C) | | | |
| No. | Unit | Details | Setting information | | Monitor information | | Unit | Setting information | | Monitor information | | Unit |
| | | | Alert | Alarm | Monitor value | Number of times of reset | | Alert | Alarm | Monitor value | Number of times of reset | |
| 1 | QUARTZ | QUARTZ BOTA | 0 | 0 | 0 | 0 | nm | 0 | 0 | 0 | 0 | H |
| 2 | | QUARTZ REACTOR TUBE | 0 | 0 | 0 | 0 | nm | 0 | 0 | 0 | 0 | H |
| 3 | | QUARTZ ADIABATIC PLATE | 0 | 0 | 0 | 0 | nm | 0 | 0 | 0 | 0 | H |
| 4 | | QUARTZ NOZZLE | 0 | 0 | 0 | 0 | nm | 0 | 0 | 0 | 0 | H |
| 5 | | QUARTZ BOAT FIXING RING | 0 | 0 | 0 | 0 | nm | 0 | 0 | 0 | 0 | H |
| 6 | | QUARTZ SEAL CAP PLATE | 0 | 0 | 0 | 0 | nm | 0 | 0 | 0 | 0 | H |
| | | | Temperature monitor information (1000~1100°C) | | | | | Temperature monitor information (1100~1200°C) | | | |
| No. | Unit | Details | Setting information | | Monitor information | | Unit | Setting information | | Monitor information | | Unit |
| | | | Alert | Alarm | Monitor value | Number of times of reset | | Alert | Alarm | Monitor value | Number of times of reset | |
| 1 | QUARTZ | QUARTZ BOTA | 0 | 0 | 0 | 0 | nm | 0 | 0 | 0 | 0 | H |
| 2 | | QUARTZ REACTOR TUBE | 0 | 0 | 0 | 0 | nm | 0 | 0 | 0 | 0 | H |
| 3 | | QUARTZ ADIABATIC PLATE | 0 | 0 | 0 | 0 | nm | 0 | 0 | 0 | 0 | H |
| 4 | | QUARTZ NOZZLE | 0 | 0 | 0 | 0 | nm | 0 | 0 | 0 | 0 | H |
| 5 | | QUARTZ BOAT FIXING RING | 0 | 0 | 0 | 0 | nm | 0 | 0 | 0 | 0 | H |
| 6 | | QUARTZ SEAL CAP PLATE | 0 | 0 | 0 | 0 | nm | 0 | 0 | 0 | 0 | H |
| | | | Temperature monitor information (1200~1300°C) | | | | | Temperature monitor information (1300~1400°C) | | | |
| No. | Unit | Details | Setting information | | Monitor information | | Unit | Setting information | | Monitor information | | Unit |
| | | | Alert | Alarm | Monitor value | Number of times of reset | | Alert | Alarm | Monitor value | Number of times of reset | |
| 1 | QUARTZ | QUARTZ BOTA | 0 | 0 | 0 | 0 | nm | 0 | 0 | 0 | 0 | H |
| 2 | | QUARTZ REACTOR TUBE | 0 | 0 | 0 | 0 | nm | 0 | 0 | 0 | 0 | H |
| 3 | | QUARTZ ADIABATIC PLATE | 0 | 0 | 0 | 0 | nm | 0 | 0 | 0 | 0 | H |
| 4 | | QUARTZ NOZZLE | 0 | 0 | 0 | 0 | nm | 0 | 0 | 0 | 0 | H |
| 5 | | QUARTZ BOAT FIXING RING | 0 | 0 | 0 | 0 | nm | 0 | 0 | 0 | 0 | H |
| 6 | | QUARTZ SEAL CAP PLATE | 0 | 0 | 0 | 0 | nm | 0 | 0 | 0 | 0 | H |

FIG. 15

| No | Monitoring item | Unit | Setting information | | Monitor information | |
|---|---|---|---|---|---|---|
| | | | Alert | Alert | Monitor value | Number of times of reset |
| EFEM | | | | | | |
| 1 | Number of times of FOUP open | Number of times | 0 | 0 | 0 | 0 |
| 2 | Number of times of FOUP mapping | Number of times | 0 | 0 | 0 | 0 |
| 1 | Number of times of LD open | Number of times | 0 | 0 | 0 | 0 |
| 2 | Atmospheric robot moving distance | m | 0 | 0 | 0 | 0 |
| LM | | | | | | |
| 1 | Number of times of LGV open | Number of times | 0 | 0 | 0 | 0 |
| 2 | Number of VENT times | Number of times | 0 | 0 | 0 | 0 |
| TM | | | | | | |
| 1 | Number of times of PM GV open | Number of times | 0 | 0 | 0 | 0 |
| 2 | Vacuum robot moving distance | m | 0 | 0 | 0 | 0 |
| PM | | | | | | |
| 1 | RF application time | H | 0 | 0 | 0 | 0 |
| 2 | Number of times of RFC operation | Number of times | 0 | 0 | 0 | 0 |
| 3 | Heater ON time | H | 0 | 0 | 0 | 0 |
| 4 | Heater heating time (operation time at temperature range) | H | 0 | 0 | 0 | 0 |
| 5 | Heater position elevation distance | m | 0 | 0 | 0 | 0 |
| 6 | Lamp ON time | H | 0 | 0 | 0 | 0 |
| 7 | Number of times of lamp ON | Number of times | 0 | 0 | 0 | 0 |
| 8 | Number of times of AV open | Number of times | 0 | 0 | 0 | 0 |
| 9 | Number of times of main valve open | Number of times | 0 | 0 | 0 | 0 |
| 10 | MFC integrated flow rate | L | 0 | 0 | 0 | 0 |
| 11 | PUMP ON time | H | 0 | 0 | 0 | 0 |
| 12 | Number of times of PM film formation | Number of times | 0 | 0 | 0 | 0 |
| 13 | PM accumulative film thickness | nm | 0 | 0 | 0 | 0 |
| Equipment | | | | | | |
| 1 | Device power ON time | H | 0 | 0 | 0 | 0 |
| 2 | Device elapsed time | H | 0 | 0 | 0 | 0 |

FIG. 16

| No. | Unit | Details | Number of times of open/Number of times of mapping | | | | | Device power ON time | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 1 | LOAD PORT 1 | FOUP1 Door | 0 | 0 | 0 | 0 | Number of times | 0 | 0 | 0 | 0 | H |
| 2 | | FOUP1 Mapping | 0 | 0 | 0 | 0 | Number of times | | | | | |
| 3 | LOAD PORT 2 | FOUP2 Door | 0 | 0 | 0 | 0 | Number of times | | | | | |
| 4 | | FOUP2 Mapping | 0 | 0 | 0 | 0 | Number of times | | | | | |
| 5 | LOAD PORT 3 | FOUP3 Door | 0 | 0 | 0 | 0 | Number of times | | | | | |
| 6 | | FOUP3 Mapping | 0 | 0 | 0 | 0 | Number of times | | | | | |
| 7 | EFEM | LD1 | | | | | | 0 | 0 | 0 | 0 | H |

| No. | Unit | Details | Atmospheric robot moving distance | | | | | Device power ON time | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 8 | EFEM | LD1 | 0 | 0 | 0 | 0 | m | 0 | 0 | 0 | 0 | H |

FIG. 17

| No. | Unit | Details | Number of times of open | | | | Device power ON time | | | | |
|---|---|---|---|---|---|---|---|---|---|---|---|
| | | | Setting information | | Monitor information | | Setting information | | Monitor information | | |
| | | | Alert | Alarm | Monitor value | Number of times of reset | Unit | Alert | Alarm | Monitor value | Number of times of reset | Unit |
| 1 | LOAD LOCK MODULE | LGV | 0 | 0 | 0 | 0 | Number of times | 0 | 0 | 0 | 0 | H |

| No. | Unit | Details | Number of times of VENT open | | | | Device power ON time | | | | |
|---|---|---|---|---|---|---|---|---|---|---|---|
| | | | Setting information | | Monitor information | | Setting information | | Monitor information | | |
| | | | Alert | Alarm | Monitor value | Number of times of reset | Unit | Alert | Alarm | Monitor value | Number of times of reset | Unit |
| 2 | LOAD LOCK MODULE | Break filter | 0 | 0 | 0 | 0 | Number of times | 0 | 0 | 0 | 0 | H |
| 3 | | Main Valve | 0 | 0 | 0 | 0 | Number of times | 0 | 0 | 0 | 0 | H |

FIG. 18

| No. | Unit | Details | Number of times of open | | | | | | |
|---|---|---|---|---|---|---|---|---|---|
| | | | Setting information | | Monitor information | | | Device power ON time | |
| | | | | | | | | Setting information | Monitor information |
| | | | Alert | Alarm | Monitor value | Number of times of reset | Unit | Alert | Alarm | Monitor value | Number of times of reset | Unit |

| No. | Unit | Details | Setting information | | Monitor information | | | Device power ON time | | | | |
|---|---|---|---|---|---|---|---|---|---|---|---|---|
| | | | Alert | Alarm | Monitor value | Number of times of reset | Unit | Alert | Alarm | Monitor value | Number of times of reset | Unit |
| 1 | TRANSFER MODULE | PM1 GV | 0 | 0 | 0 | 0 | Number of times | 0 | 0 | 0 | 0 | H |
| 2 | | PM2 GV | 0 | 0 | 0 | 0 | Number of times | 0 | 0 | 0 | 0 | H |
| 3 | | PM3 GV | 0 | 0 | 0 | 0 | Number of times | 0 | 0 | 0 | 0 | H |
| 4 | | PM4 GV | 0 | 0 | 0 | 0 | Number of times | 0 | 0 | 0 | 0 | H |

| No. | Unit | Details | Vacuum robot moving distance | | | | | Device power ON time | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 5 | TRANSFER MODULE | TH | 0 | 0 | 0 | 0 | m | 0 | 0 | 0 | 0 | H |

FIG. 19

Component PM management

| No. | Unit | Details | Heater ON time | | | | |
|---|---|---|---|---|---|---|---|
| | | | Setting information | | Monitor information | | |
| | | | Alert | Alarm | Monitor value | Number of times of reset | Unit |
| 1 | HEATER | HT terminal | 0 | 0 | 0 | 0 | H |

| No. | Unit | Details | Heater position elevation distance | | | | | Device power ON time | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 1 | HEATER UP & DOWN UNIT | PE axis | 0 | 0 | 0 | 0 | m | 0 | 0 | 0 | 0 | H |

Heater temperature history management

| No. | Unit | Details | Temperature monitor time (0~100 ℃) | | | | | Temperature monitor time (100~200 ℃) | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 1 | HEATER | HT terminal | 0 | 0 | 0 | 0 | H | 0 | 0 | 0 | 0 | H |

| No. | Unit | Details | Temperature monitor time (200~300 ℃) | | | | | Temperature monitor time (300~400 ℃) | | | | |
|---|---|---|---|---|---|---|---|---|---|---|---|---|
| | | | | | Monitor information | | | | | Monitor information | | |
| | | | Alert | Alarm | Monitor value | Number of times of reset | Unit | Alert | Alarm | Monitor value | Number of times of reset | Unit |
| 1 | HEATER | HT terminal | 0 | 0 | 0 | 0 | H | 0 | 0 | 0 | 0 | H |

| No. | Unit | Details | Temperature monitor time (400~500 ℃) | | | | | Temperature monitor time (500~600 ℃) | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 1 | HEATER | HT terminal | 0 | 0 | 0 | 0 | H | 0 | 0 | 0 | 0 | H |

| No | Unit | Details | Temperature monitor time (600~700 ℃) | | | | | Temperature monitor time (700~800 ℃) | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 1 | HEATER | HT terminal | 0 | 0 | 0 | 0 | H | 0 | 0 | 0 | 0 | H |

| No. | Unit | Details | Temperature monitor time (800~900 ℃) | | | | | Temperature monitor time (900~1000 ℃) | | | | |
|---|---|---|---|---|---|---|---|---|---|---|---|---|
| | | | Setting information | | Monitor information | | | Setting information | | Monitor information | | |
| | | | Alert | Alarm | Monitor value | Number of times of reset | Unit | Alert | Alarm | Monitor value | Number of times of reset | Unit |
| 1 | HEATER | HT terminal | 0 | 0 | 0 | 0 | H | 0 | 0 | 0 | 0 | H |

FIG. 20

Number of times of PM film formation

| No. | Unit | Details | Setting information | | Monitor information | | Unit |
|---|---|---|---|---|---|---|---|
| | | | Alert | Alarm | Monitor value | Number of times of reset | |
| 1 | CHAMBER UPPER | SHOWER PLATE | 0 | 0 | 0 | 0 | Number of times |
| 2 | | DOME | 0 | 0 | 0 | 0 | Number of times |
| 3 | CHAMBER LOWER | GATE COVER | 0 | 0 | 0 | 0 | Number of times |
| 4 | | EXH COVER | 0 | 0 | 0 | 0 | Number of times |
| 5 | | INNER WALL | 0 | 0 | 0 | 0 | Number of times |
| 6 | | OUTER RING | 0 | 0 | 0 | 0 | Number of times |
| 7 | | LOWER WALL | 0 | 0 | 0 | 0 | Number of times |
| 8 | | INNER RING | 0 | 0 | 0 | 0 | Number of times |
| 9 | | MACHING BOX | 0 | 0 | 0 | 0 | Number of times |

Device power ON time

| | | | Setting information | | Monitor information | | Unit |
|---|---|---|---|---|---|---|---|
| | | | Alert | Alarm | Monitor value | Number of times of reset | |
| 1 | CHAMBER UPPER | SHOWER PLATE | 0 | 0 | 0 | 0 | H |
| 2 | | DOME | 0 | 0 | 0 | 0 | H |
| 3 | CHAMBER LOWER | GATE COVER | 0 | 0 | 0 | 0 | H |
| 4 | | EXH COVER | 0 | 0 | 0 | 0 | H |
| 5 | | INNER WALL | 0 | 0 | 0 | 0 | H |
| 6 | | OUTER RING | 0 | 0 | 0 | 0 | H |
| 7 | | LOWER WALL | 0 | 0 | 0 | 0 | H |
| 8 | | INNER RING | 0 | 0 | 0 | 0 | H |
| 9 | | MACHING BOX | 0 | 0 | 0 | 0 | H |

Number of times of lamp ON

| No. | Unit | Details | Setting information | | Monitor information | | Unit |
|---|---|---|---|---|---|---|---|
| | | | Alert | Alarm | Monitor value | Number of times of reset | |
| 10 | RAMP | RAMP | 0 | 0 | 0 | 0 | Number of times |

Lamp ON time

| | | | Setting information | | Monitor information | | Unit |
|---|---|---|---|---|---|---|---|
| | | | Alert | Alarm | Monitor value | Number of times of reset | |
| 10 | RAMP | RAMP | 0 | 0 | 0 | 0 | H |

Number of times of RF application

| No. | Unit | Details | Setting information | | Monitor information | | Unit |
|---|---|---|---|---|---|---|---|
| | | | Alert | Alarm | Monitor value | Number of times of reset | |
| 11 | RF | RF power | 0 | 0 | 0 | 0 | Number of times |

RF application time

| | | | Setting information | | Monitor information | | Unit |
|---|---|---|---|---|---|---|---|
| | | | Alert | Alarm | Monitor value | Number of times of reset | |
| 11 | RF | RF power | 0 | 0 | 0 | 0 | H |

SUBSTRATE PROCESSING APPARATUS AND RECORDING MEDIUM

CROSS-REFERENCE TO RELATED APPLICATION

This application is a bypass continuation application of international application No. PCT/JP2015/060097 having an international filing date of Mar. 31, 2015 and designating the United States, the entire contents of which are incorporated herein by reference.

TECHNICAL FIELD

The present disclosure relates to management of maintenance components of a semiconductor manufacturing apparatus which is a type of substrate processing apparatus for processing a substrate.

BACKGROUND

Maintenance components of a semiconductor manufacturing apparatus have their respective determined lifetimes and maintenance cycles. Typically, device makers (customers using semiconductor manufacturing apparatus) carry out a cleaning operation for components managed with cumulative film thickness, such as quartz components and exhaust pipes, and exchange components as necessary. In addition, overhaul (O/H) and adjustment (calibration) for preventive maintenance are carried out on the basis of elapsed time. However, if is common for components (maintenance components) except some components such as quartz components as mentioned above to be exchanged exclusively when they are out of order (when they have some trouble). This is because the environment that the maintenance components are being used cannot be accurately grasped.

For example, a timing of failure of a maintenance component is the cause of a lot-out if the device is in operation (producing products). With the increase in diameter of silicon wafers, the high integration of semiconductor devices and the 3D structuralization, as the amount of damage due to increasing of lot-out, it is necessary to take more measures for stable operation of the device.

SUMMARY

Some embodiments of the present disclosure provide a technique capable of grasping the use situation of components constituting a substrate processing apparatus.

According to one embodiment of the present disclosure, there is provided a constitution that includes a data collection controller configured to hold monitoring item list information and component management information, and each of the monitoring item list information and the component management information holds monitoring item information indicative of a monitoring item for monitoring a maintenance component selected as a monitoring target, setting information for setting a threshold value of the maintenance component, monitoring data of the maintenance component, and monitoring information including a number of times of resetting by which the maintenance component is initialized; and wherein, the component management information is configured to hold the monitoring information for each unit including the maintenance component according to the monitoring item, and, an operation part configured to provide the data collection controller with the monitoring data from device data collected from the unit, wherein the data collection controller is configured to notify the operation pan that the monitoring data included in at least one of the component management information and the monitoring item list information has reached a threshold value, wherein the operation part is configured to transmit an instruction for initializing the monitoring data to the data collection controller after maintenance of the unit in which the monitoring data that has reached the threshold value is generated is completed, and wherein the data collection controller is configured to count the number of times of resetting by initializing the monitoring data of the component management information and initialize the monitoring data of the monitoring item list information according to the contents of the maintenance.

BRIEF DESCRIPTION OF DRAWINGS

FIG. 5 is a view for explaining definitions of maintenance components suitably used in the substrate processing apparatus of the present disclosure.

FIG. 8 is an illustrative example of a maintenance component monitoring item list screen (vertical semiconductor manufacturing apparatus) according to one embodiment of the present disclosure.

FIG. 9A is an illustrative example of a maintenance component management screen (vertical semiconductor manufacturing apparatus) according to one embodiment of the present disclosure.

FIG. 9B is an illustrative example of a maintenance component management screen (vertical semiconductor manufacturing apparatus) according to one embodiment of the present disclosure.

FIG. 9C is an illustrative example of a maintenance component management screen (vertical semiconductor manufacturing apparatus) according to one embodiment of the present disclosure.

FIG. 9D is an illustrative example of a maintenance component management screen (vertical semiconductor manufacturing apparatus) according to one embodiment of the present disclosure.

FIG. 9E is an illustrative example of a maintenance component management screen (vertical semiconductor manufacturing apparatus) according to one embodiment of the present disclosure.

FIG. 9F is an illustrative example of a maintenance component management screen (vertical semiconductor manufacturing apparatus) according to one embodiment of the present disclosure.

FIG. 9G is an illustrative example of a maintenance component management screen (vertical semiconductor manufacturing apparatus) according to one embodiment of the present disclosure.

FIG. 15 is an illustrative example of a maintenance component monitoring item list screen (single wafer semiconductor manufacturing apparatus) according to one embodiment of the present disclosure.

FIG. 16 is an illustrative example of a maintenance component management screen (single wafer semiconductor manufacturing apparatus) according to another embodiment of the present disclosure.

FIG. 17 is an illustrative example of a maintenance component management screen (single wafer semiconductor manufacturing apparatus) according to another embodiment of the present disclosure.

FIG. 18 is an illustrative example of a maintenance component management screen (single wafer semiconductor manufacturing apparatus) according to another embodiment of the present disclosure.

FIG. 19 is an illustrative example of a maintenance component management screen (single wafer semiconductor manufacturing apparatus) according to another embodiment of the present disclosure.

FIG. 20 is an illustrative example of a maintenance component management screen (single wafer semiconductor manufacturing apparatus) according to another embodiment of the present disclosure.

DETAILED DESCRIPTION

Figure 1:
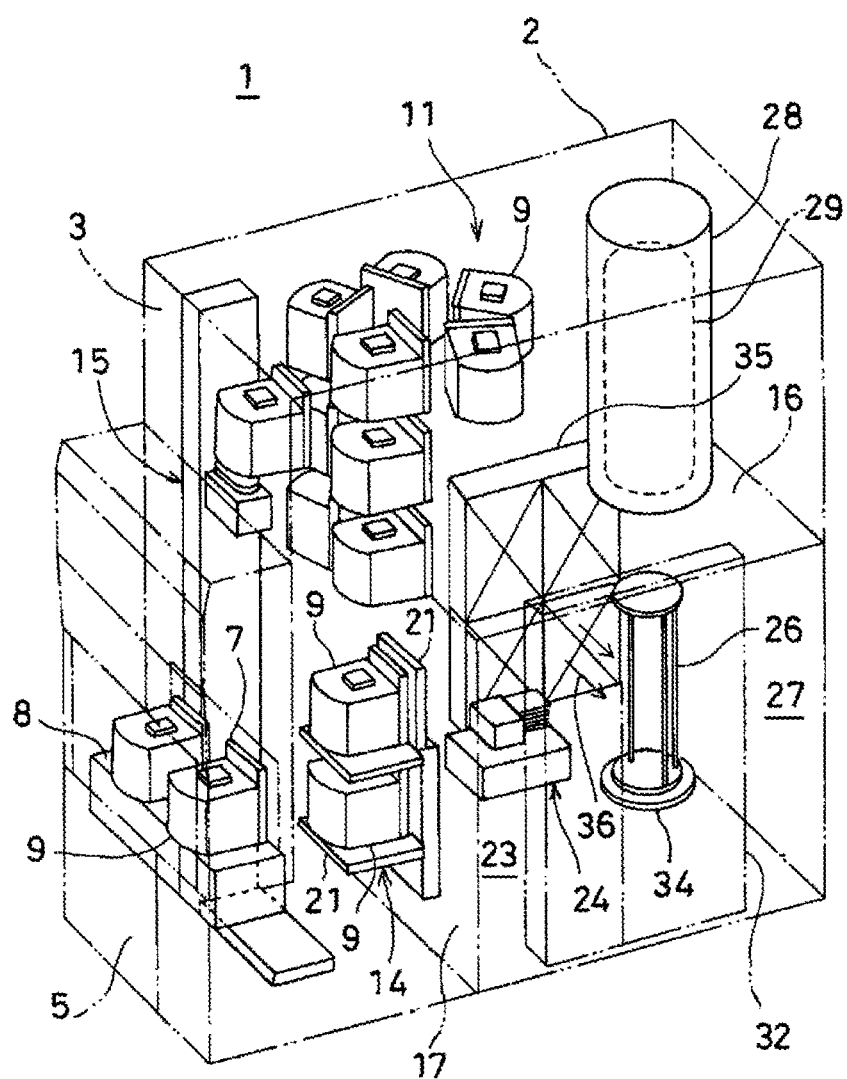
FIG. 1 is a perspective view showing a substrate processing apparatus suitably used in one embodiment of the present disclosure.

Embodiments of the present disclosure will be now described in detail with reference to the drawings. Like or equivalent components, members, and processes illustrated in each drawing are given the reference numerals and a repeated description thereof will be properly omitted. Further, the embodiments are presented by way of example only, and are not intended to limit the present disclosure, and any feature or combination thereof described in the embodiments may not necessarily be essential to the present disclosure.

Figure 2:
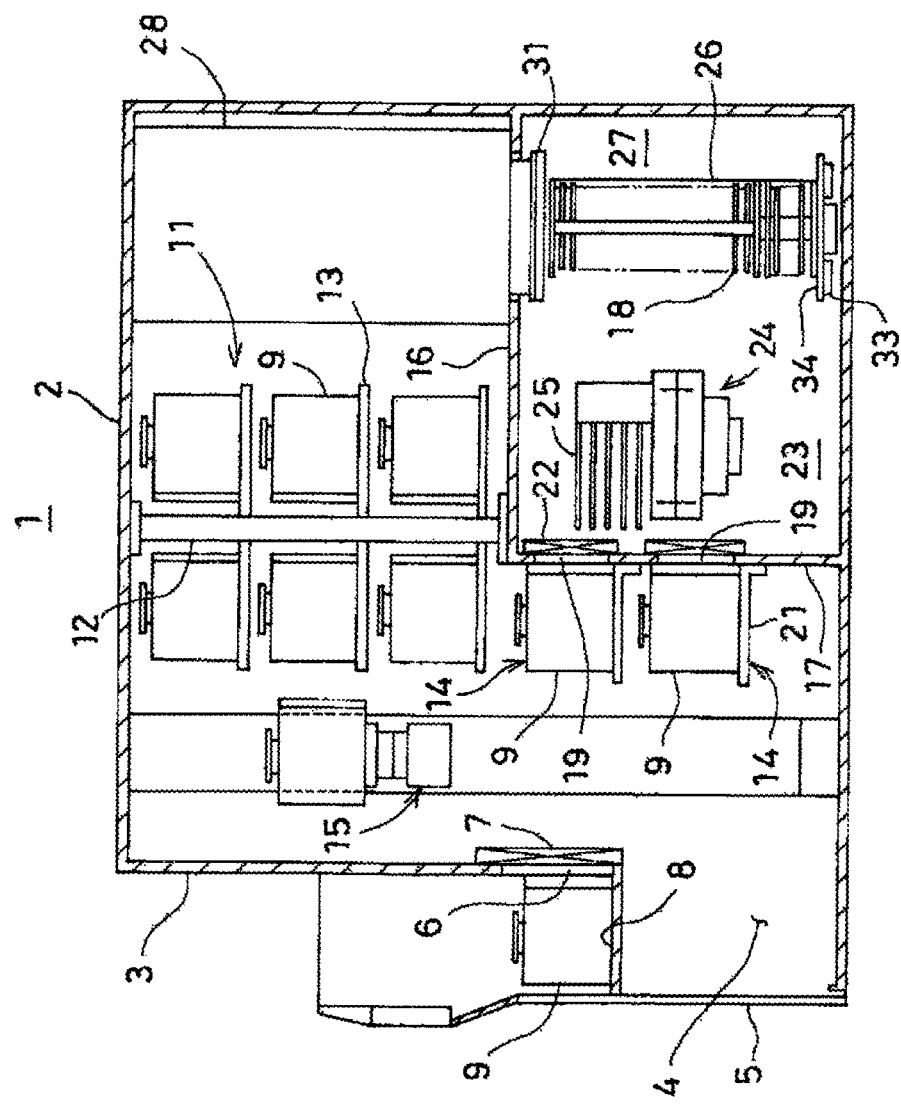
FIG. 2 is a side sectional view showing the substrate processing apparatus suitably used in one embodiment of the present disclosure.

Hereinafter, one embodiment of the present disclosure will be described with reference to the drawings. First, a substrate processing apparatus 1 in which the present disclosure is practiced will be described with reference to FIGS. 1 and 2.

The substrate processing apparatus 1 has a housing 2. A front maintenance port 4 as an opening in which maintenance can be performed is formed in a lower portion of the front wall 3 of the housing 2. The front maintenance port 4 can be opened/closed by a front maintenance door 5.

A pod loading/unloading port 6 is formed in the front wall 3 of the housing 2 so as to communicate between the inside and the outside of the housing 2. The pod loading/unloading port 6 can be opened/closed by a front shutter (loading unloading port opening/closing mechanism) 7. A load port (substrate transfer container delivery table) 8 is installed on the front side of the pod loading/unloading port 6. The load port 8 is configured to align a location of pods 9 which are mounted.

The pod 9 is a sealed type substrate transfer container and is loaded onto the load port 8 by an in-process transfer device (not shown) and is unloaded from the load port 8.

A rotary pod shelf (substrate transfer container storage shelf) 11 is installed in an upper portion of the housing 2 at a substantially central portion in the front-rear direction. The rotary pod shelf 11 is configured to store a plurality of pods 9.

The rotary pod shelf 11 includes a support pillar 12 vertically installed erectly so as to be rotated intermittently, and shelf boards of a plurality of stages (substrate transfer container mounting shelves) 13 radially supported at the upper, middle, and lower positions on the support pillar 12. The shelf boards 13 are configured to store the pods 9 in a state such that a plurality of the pods 9 is mounted.

A pod opener (substrate transfer container lid opening/closing mechanism) 14 is installed below the rotary pod shelf 11. The pod opener 14 is configured to mount the pod 9 and open/close the lid of the pod 9.

A pod transfer mechanism (container transfer mechanism) 15 is installed between the load port 8, the rotary pod shelf 11 and the pod opener 14. The pod transfer mechanism 15 can move up and down while holding the pod 9 and can advance and retract in the horizontal direction. The pod transfer mechanism 15 is configured to transfer the pod 9 between the load port 8, the rotary pod shelf 11 and the pod opener 14.

A sub housing 16 is provided over the rear end of the housing 2 at a lower portion in a substantially central portion in the front and rear direction of the housing 2. A pair of wafer loading/unloading ports (substrate loading/unloading ports) 19 is formed in the front wall 17 of the sub housing 16 in two upper and lower stages in the vertical, direction so as to load/unload wafers (substrates) 18 into/from the sub housing 16. The pod opener 14 is installed in each, of the upper and lower wafer loading/unloading ports 19 and 19.

The pod opener 14 includes a mounting, table 21 on which the pod 9 is mounted and an opening/closing mechanism 22 for opening closing the lid of the pod 9. The pod opener 14 is configured to open/close a wafer gateway of the pod 9 by opening/closing the lid of the pod 9 mounted on the mounting table 21 by the opening/closing mechanism 22.

The sub housing 16 constitutes a transfer chamber 23 that is airtight from a space (pod transfer space) in which the pod transfer mechanism 15 and the rotary pod shelf 11 are disposed. A wafer transfer mechanism (substrate transfer mechanism) 24 is installed in the front region of the transfer chamber 23. The wafer transfer mechanism 24 includes wafer mounting plates 25 of the required number (5 wafer mounting plates 25 in the figure) on which the wafers 18 are mounted. Each wafer mounting plate 25 is configured to move linearly in the horizontal direction, rotate in the horizontal direction, and move up/down in the vertical direction. The water transfer mechanism 24 is configured to load-unload the wafer 18 onto/from a boat (substrate holder) 26.

A standby part 27 configured to accommodate the boat 26 and make the boat 26 stand by is formed in the rear region of the transfer chamber 23, and a vertical process furnace 28 is installed above the standby part 27. The process furnace 28 includes a process chamber 29 formed therein. A furnace opening portion is formed at a lower end portion of the process chamber 29. The furnace opening portion is configured to be opened/closed by a furnace opening shutter (furnace opening/closing mechanism) 31.

A boat elevator (substrate holder elevating mechanism) 32 for moving up/down the boat 26 is installed between the right end portion of the housing 2 and the right end portion of the standby part 27 of the sub housing 16. A seal cap 34 as a lid is horizontally attached to an arm 33 connected to the elevator base of the boat elevator 32. The seal cap 34 vertically supports the boat 26 and is configured to block the furnace opening portion air-tightly in a state where the boat 26 is charged in the process chamber 29.

The boat 26 is configured to hold a plurality of wafers 18 (for example, 50 to 125 wafers 18) in multiple stages by aligning the centers of wafers 18 in a horizontal attitude.

A clean unit 35 is disposed at a position opposed to a position of the boat elevator 32. The clean unit 35 is constituted by a supply fan and a dustproof filter so as to supply clean air 36 which is a cleaned atmosphere or an inert gas. A notch aligner (not shown) as a substrate aligning device configured to align the positions of the wafers 18 in the circumferential direction is installed between the wafer transfer mechanism 24 and the clean unit 35.

The clean air 36 blown out from the clean unit 35 is configured to be sucked by a duct (not shown) after being circulated through the notch aligner (not shown), the wafer transfer mechanism 24 and the boat 26, and then exhausted out of the housing 2 or blown out into the transfer chamber 23 by the clean unit 35.

Next, the operation of the substrate processing apparatus 1 will be described.

When the pod 9 is supplied into the load port 8, the pod loading/unloading port 6 is opened by the front shutter 7. The pod 9 on the load port 8 is loaded into the housing 2 by the pod transfer mechanism 15 through the pod loading/unloading port 6 and is mounted on a designated shelf board 13 of the rotary pod shelf 11. After the pod 9 is temporarily stored in the rotary pod shelf 11, the pod 9 is transferred from the shelf board 13 to one of the pod openers 14 by the pod transfer mechanism 15 and then is transferred onto the mounting table 21, or is directly transferred from the load port 8 onto the mounting table 21.

At this time, the wafer loading/unloading port 19 is closed by the opening/closing mechanism 22, and the clean air 36 is circulated, and filled in the transfer chamber 23. For example, the transfer chamber 23 is filled with a nitrogen gas as the clean air 36, so that the oxygen concentration is set to 20 ppm or less, i.e. even lower than the oxygen concentration in the interior (air atmosphere) of the housing 2.

The opening end lace of the pod 9 mounted on the mounting table 21 is pressed against the opening edge portion of the wafer loading/unloading port 19 in the front wall 17 of the sub housing 16 and the lid of the pod 9 is removed by the opening/closing mechanism 22 at the same time, so that the wafer gateway is opened.

When the pod 9 is opened by the pod opener 14, a wafer 18 is taken out from the pod 9 by the wafer transfer mechanism 24, and then the wafer 18 is transferred to the notch aligner (not shown). After the wafer 18 is aligned by the notch aligner, the wafer transfer mechanism 24 loads the wafer 18 into the standby part 27 which is at the rear side of the transfer chamber 23, and then loads (charges) the wafer 18 in the boat 26.

The wafer transfer mechanism 24 having transferred the wafer 18 to the boat 26 returns to the pod 9 and charges the next wafer 18 in the boat 26.

During a loading process of the wafer 18 in the boat 26 by the wafer transfer mechanism 24 in one (upper or lower) pod opener 14, another pod 9 is transferred by the pod transfer mechanism 15 from the rotary pod shelf 11 to the other (lower or upper) pod opener 14, and is opened by the other pod opener 14 at the same time.

When the predetermined number of wafers 18 are loaded in the boat 26, the furnace opening portion of the process furnace 28 which has been closed by the furnace opening shutter 31 is opened by the furnace opening shutter 31. Subsequently, the boat 26 is raised by the boat elevator 32, and then loaded into the process chamber 29.

After the loading, the furnace opening portion is air-tightly closed by the seal cap 34. In this embodiment, at this timing (after the loading), a purging process (pre-purging process) is performed in which the atmosphere of the process chamber 29 is replaced with an inert gas.

The process chamber 29 is evacuated by a gas exhaust mechanism (not shown) so that the process chamber 29 has a desired pressure (degree of vacuum). In addition, the process chamber 29 is heated to a predetermined temperature by a heater driving part (not shown) so that the process chamber 29 has a desired temperature distribution.

In addition, a processing gas controlled as a predetermined flow rate is supplied by a gas supply mechanism (not shown), in the course of allowing the flow of the processing gas to circulate through the process chamber 29, as the processing gas comes into contact with the surface of the wafer 18, a predetermined process is practiced on the surface of the wafer 18. Further, the processing gas remaining after reaction is exhausted from the process chamber 29 by the gas exhaust mechanism.

After a lapse of a preset processing time, an inert gas is supplied from an inert gas supply source (not shown) by the gas supply mechanism to replace the atmosphere of the process chamber 29 with the inert gas and return the process chamber 29 to the normal pressure (after-purge step). Then, the boat 26 is moved down via the seal cap 34 by the boat elevator 32.

For unloading the processed wafer 18, the wafer 18 and the pod 9 are discharged outside of the housing 2 in the order reverse to the above-described order. An unprocessed wafer 18 is loaded into the boat 26 and the batch processing of the water 18 is repeated.

Figure 3:
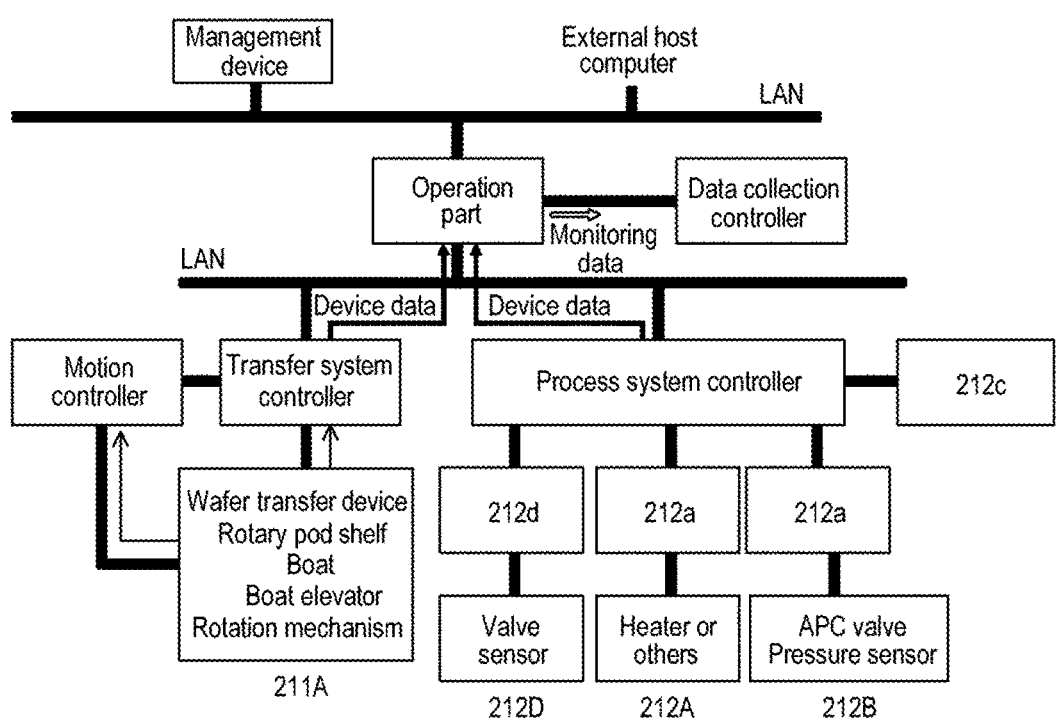
FIG. 3 is a sectional view showing a controller configuration (a vertical semiconductor manufacturing apparatus) suitably used in one embodiment of the present disclosure.
Figure 4:
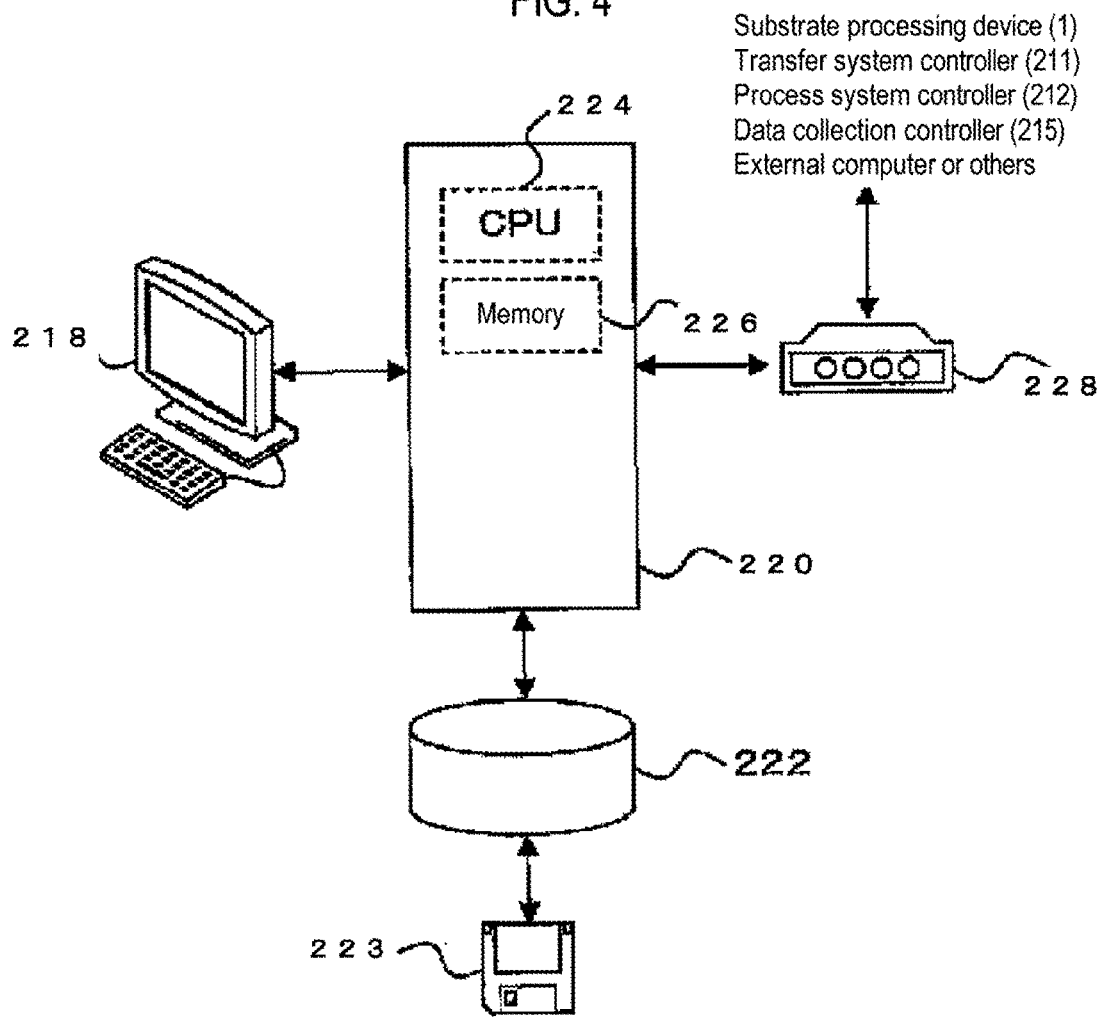
FIG. 4 is a view showing a configuration of a main controller (an operation part) suitably used in one embodiment of the present disclosure.

With reference to FIGS. 3 and 4, a description of the process furnace 28, a transfer mechanism including at least the pod transfer mechanism 15 which is at least a mechanism for transferring a substrate, the wafer transfer mechanism 24, the boat elevator 32 and the like, the gas supply mechanism for supplying a processing gas and the like to the process, furnace 28, the gas exhaust mechanism for exhausting the interior of the process furnace 28, the heater driving part for heating the process furnace 28 to a predetermined temperature, and a control system 240 that controls the process furnace 28, the transfer mechanism, the gas supply mechanism, the gas exhaust mechanism and the heater driving part will be described is provided below.

Next, the configuration of the control system 240 around, an operation part 201 as a main controller will be described with reference to FIG. 3. As shown in FIG. 3, the control system 240 includes the main controller 201, a transfer system controller 211 as a transfer control part, a process system controller 212 as a process control part, a management device, and a data collection controller 215 as a data monitoring part. The main controller 201 is electrically connected to the transfer system controller 211 and the process system controller 212 via a LAN (Local Area Network), for example 100BASE-T and the like, thereby allowing transmission and reception of device data, downloading and uploading of files, etc.

The main controller 201 is provided with a port serving as a mounting part. A USB memory and the like, which is a recording medium as an external storage device, is inserted/removed into/from the mounting part. An OS corresponding to this port is installed in the main controller 201. Further, the main controller 201 is connected to an external host computer (not shown) via a communication network, for example. Therefore, even when the substrate processing apparatus 1 is installed in a clean room, the host computer can be disposed in an office or the like outside of the clean room. The management device is connected to the substrate processing apparatus 1 via a LAN line and has a function of collecting device data from the operation part 201.

The data collection controller 215 is connected to the operation part 201 via a LAN line and has a function of collecting monitoring data of maintenance components from the operation part 201. The maintenance components are preset among the device data. Here, the monitoring data is data for monitoring maintenance information of each of the components, constituting the substrate processing apparatus 1. Here, three types of maintenance components to be monitored are defined in advance, as shown in FIG. 5 to be described later.

Figure 10:
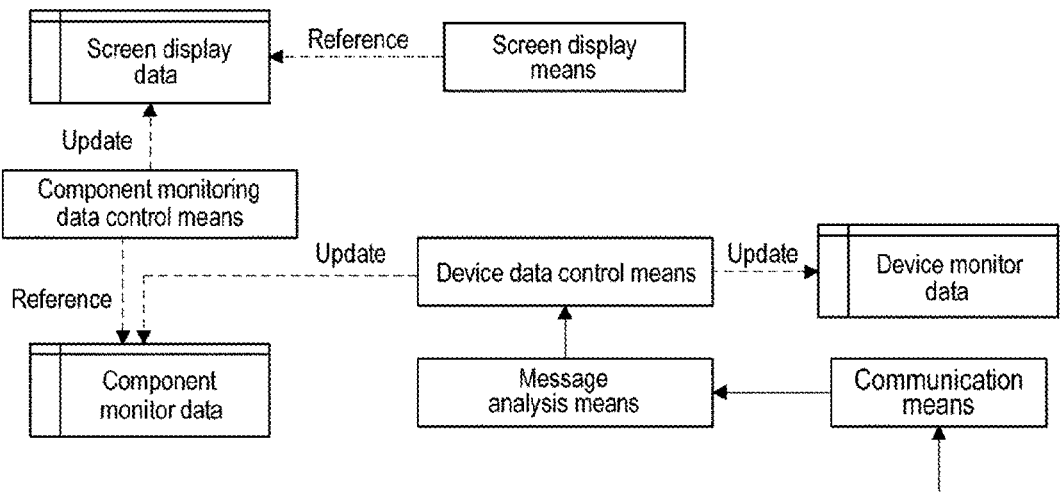
FIG. 10 is an illustrative example for explaining a data collection controller according to one embodiment of the present disclosure.
Figure 11:
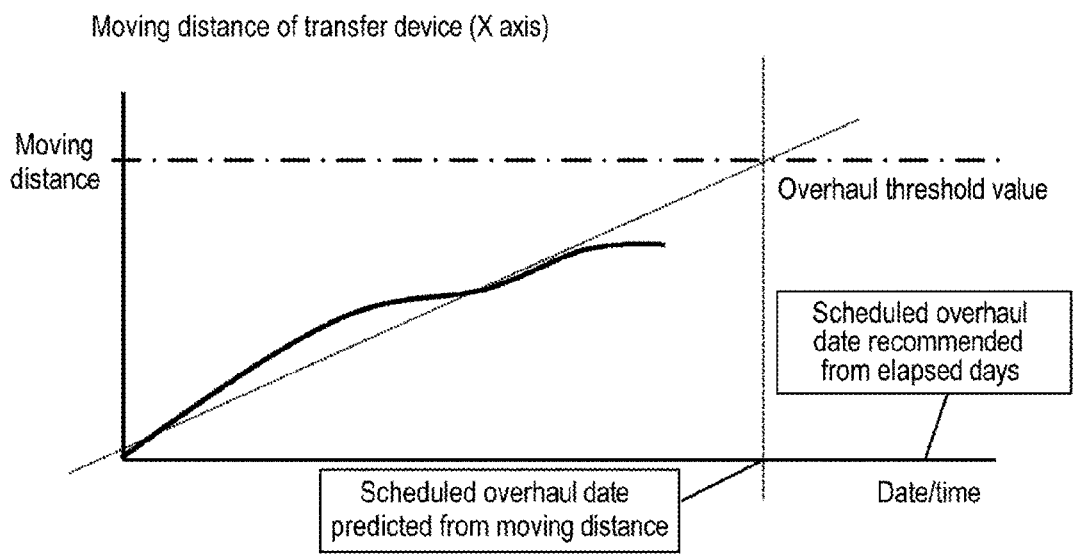
FIG. 11 is an illustrative example for explaining maintenance component management (graphics of monitoring data) according to an embodiment of the present disclosure.

The data collection controller 215 will be described with reference to FIG. 10. As shown in FIG. 10, the data collection controller 215 includes a communication part that exchanges various data with the operation pan 201, a message analyzing part that receives the device data transmitted from the substrate processing apparatus via the communication part and allocates a request message or a notification message including the device data to each of the various parts in accordance with the contents of the message, a device data control part that by referring to data received from the communication part, updates the monitoring data when the data is monitoring data and/or updates the device data when the data is the device data, a monitoring data control part that processes the monitoring data into data for screen display and updates the screen display data, and a screen display part that displays various data on a screen. This functional configuration is merely an example. For example, the screen display part may not exist, or even be replaced with the operation part 201 and a terminal or the like connected for screen reference. The data collection controller 215 has the function of a database for collecting device data and can create a graph in chronological order using stored monitoring data or device data, as shown in FIG. 11 described later. Further, the function of processing the device data to create the monitoring data may be incorporated in any controller of the main controller 201 as the operation part, the transfer system controller 211 as the transfer control part, the process system controller 212 as the process control part, and the data collection controller 215 as the data monitoring part. Further, in this embodiment, the operation part 201 has only the function of wafer processing (substrate processing) and reporting to the host, but the present disclosure is not limited thereto. For example, the function of the data collection controller 215 of collecting and managing data (the monitoring data) on maintenance components may be incorporated in the main controller 201. In other words, various parts shown in FIG. 10 to be described later may be incorporated in the main controller (operation part) 201.

The transfer system controller 211 is connected to a substrate transfer system 211A including mainly the rotary pod shelf 11, the boat elevator 32, the pod transfer mechanism (substrate container transfer mechanism) 15, the wafer transfer mechanism (substrate transfer mechanism) 24, the boat 26 and a rotation mechanism (not shown). The transfer system controller 211 is configured to control the transfer operation, of each of the rotary pod shelf 11, the boat elevator 32, the pod transfer mechanism (substrate container transfer mechanism) 15, the wafer transfer mechanism (substrate transfer mechanism) 24, the boat 26 and a rotation mechanism (not shown). In particular, the transfer system control let 211 is configured to control the transfer operation, of each of the boat elevator 32, the pod transfer mechanism (substrate container transfer mechanism) 15 and the wafer transfer mechanism (substrate transfer mechanism) 24 via a motion controller 216.

The process system controller 212 includes a temperature controller 212a, a pressure controller 212b, a gas flow rate controller 212c and a sequencer 212d. The temperature controller 212a, the pressure controller 212b, the gas now rate controller 212c and the sequencer 212d constitute a sub controller and are electrically connected to the process system controller 212, thereby allowing transmission and reception of data, downloading and uploading of files, etc. Although the process system controller 212 and the sub controller are shown separately, they may be integrated.

A heating mechanism 212A including mainly a heater and a temperature sensor and the like is connected to the temperature controller 212a. The temperature controller 212a is configured to control the internal temperature of the process furnace 28 by controlling the temperature of the heater of tire process furnace 28. In addition, the temperature controller 212a is configured to control switching (on/off) of a thyristor so as to control power to be supplied to a heater wire.

A gas exhaust mechanism 212B including mainly a pressure sensor, an APC valve as a pressure valve, and a vacuum pump is connected to the pressure controller 212b. Based on a pressure value detected by the pressure sensor, the pressure controller 212b is configured to control the degree of opening of the APC valve and the switching (on/off) of the vacuum pump so that the internal pressure of the process chamber 29 becomes a desired pressure at a desired timing.

The gas flow rate controller 212c includes an MFC (Mass Flow Controller). The sequencer 212d is configured to control supply and stoppage of gases from a processing gas supply pipe and a purge gas supply pipe by opening/closing a valve 212D. Further, the process system controller 212 is configured to control the gas flow rate controller 212c (the MFC) and the sequencer 212d (tire valve 212D) so that the flow rate of a gas supplied into the process chamber 29 becomes a desired flow rate at a desired timing.

The main controller 201, the transfer system controller 211 and the process system controller 212 according to an embodiment of the present disclosure can be realized by using a typical computer system instead of an exclusive system. For example, by installing programs for executing the above-described processes on a general-purpose computer from a recording medium (a flexible disk, a CD-ROM, a USB, or the like) that stores the program, the controllers may be configured to perform respective predetermined processes of the program.

Means for supplying these programs are optional. Besides being supplied via the recording medium as described above, these programs may be supplied via a communication line, a communication network, a communication system, or the like. In this case, for example, the programs may be posted on a bulletin board of the communication network, and may be provided by overlapping them on a carrier wave, via the communication network. Then, the predetermined processes can be performed by executing the programs under the control of the OS in the same manner as other application programs.

Next, the configuration of the operation part 201 will be described with reference to FIG. 4.

The operation part 201 is implemented with a computer including a CPU (Central Processing Unit) 224 as a processor, a memory (RAM, ROM, etc.) 226 as a transitory storage, a hard disk (HDD) 272 as a storage, a transceiver module 228 as a communication part, a display device 218 as a display part, and a clock function (not shown). The hard disk 222 stores each of the recipe files such as recipes in which processing conditions and processing procedures are defined, control program files for executing each of the recipe files, parameter files for setting the processing conditions and processing procedures, error processing program files, error processing parameter files, various screen files including an input screen for inputting process parameters, various icon files, and the like (none shown). In this embodiment, a component management program (see FIG. 6) for managing maintenance components of the semiconductor manufacturing apparatus and the like are stored in the hard disk 222. Further, screen tables (files) of screens shown in FIGS. 7 to 9, 11, 12 and 14 to 20 to be described later are stored in the hard disk 222.

The display device 218 as the display part is configured to display an operation screen for operating the substrate processing apparatus 1. The operation screen of the display device 215 is, for example, a liquid crystal display panel. The operation screen of the display device 218 includes a screen for confirming the states of the substrate transfer system and the substrate processing system. For example, the operation screen of the display device 215 may be provided with operation buttons as input parts for inputting operation instructions to the substrate transfer system 211A and the substrate processing system (the heating mechanism 212A, the gas exhaust mechanism 212B and the gas supply system 212C) as shown in FIG. 3. The display device 218 displays information generated in the substrate processing apparatus 1 on the operation screen. The display device 218 outputs the information displayed on the operation screen to a device such as a USB memory inserted in the main controller 201. Further, the display device 218 receives input data (input instruction) of an operator from the operation screen and transmits the input data to the main controller 201. Further, the display device 218 is configured to receive an instruction (control instruction) for executing an arbitrary substrate processing recipe (also referred to as a process recipe) among recipes deployed on a memory (RAM) to be described later or a plurality of recipes stored in a storage to be described later, and to transmit it to the main controller 201. Further, the data collection controller 215 is configured to deploy each of the stored screen tables by executing a component management program, and to display the screens shown in FIGS. 7 to 9, 11, 12 and 14 to 20 on the display part 218 by reading the data.

A switching hub or the like is connected to the transceiver module 228 of the operation part 201 and the operation part 201 exchange data with an external computer or the like via a network. The operation part 201 may include a main control part 220 including at least a CPU 224 and a memory 226, the transceiver module 228 transmitting/receiving data with the external computer or the like visa network, a storage 222 such as a hard disk drive, and a user interface (UI) part including a display part such as a liquid crystal display and a pointing device such as a keyboard and a mouse. Further, it is possible that the main control part 220 includes the transceiver module 228.

Further, the main controller 201 transmits device data such as the state of the substrate processing apparatus 1 to an external higher-level computer, for example, a host computer, via a network (not shown). The substrate processing apparatus 1 is, for example, a vertical type device that performs oxidation, diffusion processing, CVD processing and the like on a substrate. In addition, the substrate processing apparatus 1 is controlled by the control system 240 based on recipe files, parameter files and the like stored in the storage 222.

(Substrate Processing Method)

Next, a substrate processing method including a predetermined processing process performed using the substrate processing apparatus 1 according to this embodiment will be described. Here, the predetermined processing process will be illustrated with a substrate processing process which is one of the processes used in manufacturing a semiconductor device.

In performing the substrate processing process, a substrate processing recipe (process recipe) corresponding to the substrate processing to be performed is deployed on a memory such as a RAM in the process system controller 212, for example. Then, as necessary, an operation instruction is given from the main controller 201 to the process system controller 212 or the transfer system controller 211. The substrate processing process performed in this manner includes at least a loading step, a film forming step and a boat transferring step. In addition, a transferring step (which, may include a substrate loading step to be described later) may be included in the substrate processing step.

(Transferring Step)

A drive instruction of the wafer transfer mechanism 24 is issued from the main controller 201 against to the transfer system controller 211. Then, according to an instruction from the transfer system controller 211, the wafer transfer mechanism 24 starts a process of transferring a wafer 18 from the pod 9 on a transfer stage 21 as the mounting table to the boat 26. This transferring process is performed until loading (wafer charging) of all scheduled wafers 18 into the boat 26 is completed.

(Loading Step)

When the specified number of wafers 18 are loaded in the boat 26, the boat 26 is moved up by the boat elevator 32 operating according to an instruction from the transfer system controller 211 and is charged (boat-loaded) into the process chamber 29 formed in the process furnace 28. When the boat 26 is completely loaded, the seal cap 34 of the boat elevator 32 is configured to air-tightly close the lower end of a manifold of the process furnace 28.

(Film Forming Step)

After that, according to an instruction from the pressure controller 212b, the interior of the process chamber 29 is evacuated by a vacuum exhauster so as to have a predetermined film forming pressure (degree of vacuum). At this time, the internal pressure of the process chamber 29 is measured by a pressure sensor and a pressure regulator is feedback-controlled based on the measured pressure information. Further, according to an instruction from the temperature controller 212a, the interior of the process chamber 29 is heated by a beater so as to have a predetermined temperature. At this time, based on the temperature information detected by a temperature sensor as a temperature detector, the condition of the electric conduction to the heater is feedback-control led so that the internal temperature of the process chamber 29 becomes a predetermined temperature (film footling temperature). Subsequently, according to an instruction from the transfer system controller 211, the rotation mechanism starts to rotate the boat 26 and the wafer 18. Then, in a state in which the interior of the process chamber 29 is maintained at the predetermined pressure and the predetermined temperature, a predetermined gas (processing gas) is supplied onto a plurality of wafers 18 held by the boat 26 so that a predetermined process (for example, film forming process) on the wafers 18 is performed.

(Unloading Step)

When the film forming step for the wafers 18 mounted on the boat 26 is completed, according to an instruction from the transfer system controller 211, then the rotation of the boat 26 and the wafers 18 by the rotation mechanism is stopped, the seal cap 34 is moved down by the boat elevator 32 to open the lower end of the manifold, and the boat 26 holding the processed wafers 18 is carried out (boat-unloaded) to the outside of the process furnace 28.

(Recovery Step)

Then, the boat 26 holding the processed wafers 18 is very effectively cooled by the clean air 36 blown out from the clean unit 35. Then, when the boat 26 is cooled to, e.g., 150 degrees C. or below, after the processed wafers 18 are removed (wafer-discharged) from the boat 26 and transferred to the pod 9, a new unprocessed wafer 18 is transferred to the boat 26.

By repeating the above-described steps by executing the process recipe, the substrate processing apparatus 1 according to this embodiment can form a silicon film on the wafers 18 with a high throughput.

(Maintenance Components of Semiconductor Manufacturing Apparatus)

Maintenance components to be used as monitoring targets will be described with reference to FIG. 5. The maintenance components of the semiconductor manufacturing apparatus are usually listed on a spare parts list which is provided to customers. The spare parts have three defined categories as parts categories. That is, the parts (components) corresponding to the categories defined in FIG. 5 are components requiring maintenance (i.e., maintenance components) described in the spare parts list. In addition, although not shown in FIG. 5, component lifetime and maintenance period of time for each of spare parts are described is the spare parts list.

Among the maintenance components of the semiconductor manufacturing apparatus, each of the expensive components, components requiring overhaul, and components to be contracted for maintenance with, a device maker service company requires indexes other than elapsed days.

Among the maintenance components of the semiconductor manufacturing apparatus, expensive components may include transfer system components such as various kinds of quartz components, heaters (including a jacket heater), thermocouples (TCs), magnetic seals, APC valves, drivers and so on, and various controllers.

Among the maintenance components of die semiconductor manufacturing apparatus, the components requiring overhaul may include transfer system components such as various kinds of quartz components, heaters (including a jacket heater), thermocouples (TCs), magnetic seal motors, drivers and so on.

Among the maintenance components of the semiconductor manufacturing apparatus, the components to be contracted for maintenance with a device maker service company may include the wafer transfer mechanism (substrate transfer mechanism) 24 as a transfer device among transfer system components such as APC valves, magnetic seals, drivers and so on.

(Maintenance Component Management Function of Semiconductor Manufacturing Apparatus)

Figure 6A:
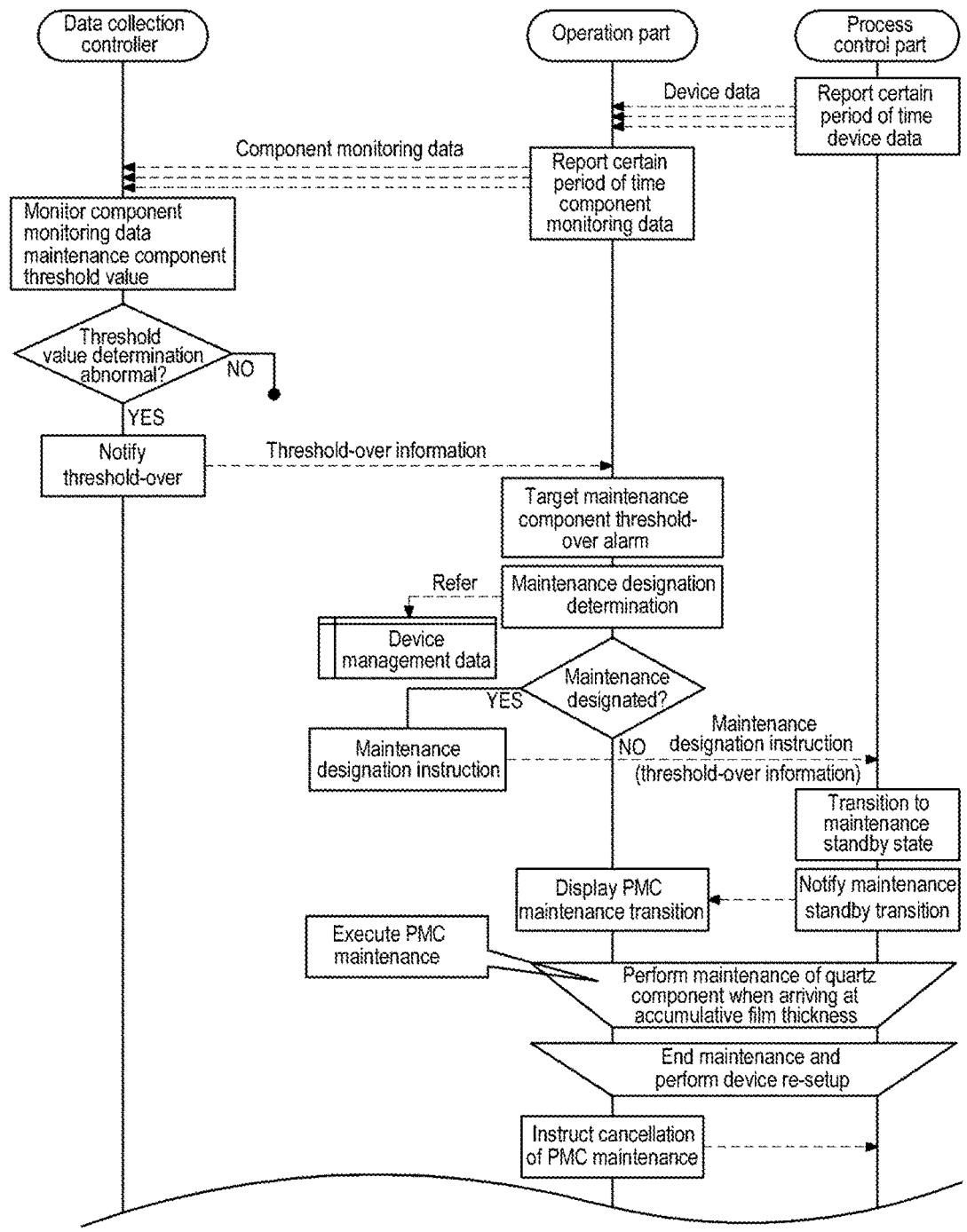
FIG. 6A is a view for explaining a processing flow of maintenance component management function suitably used in the substrate processing apparatus of the present disclosure.
Figure 6B:
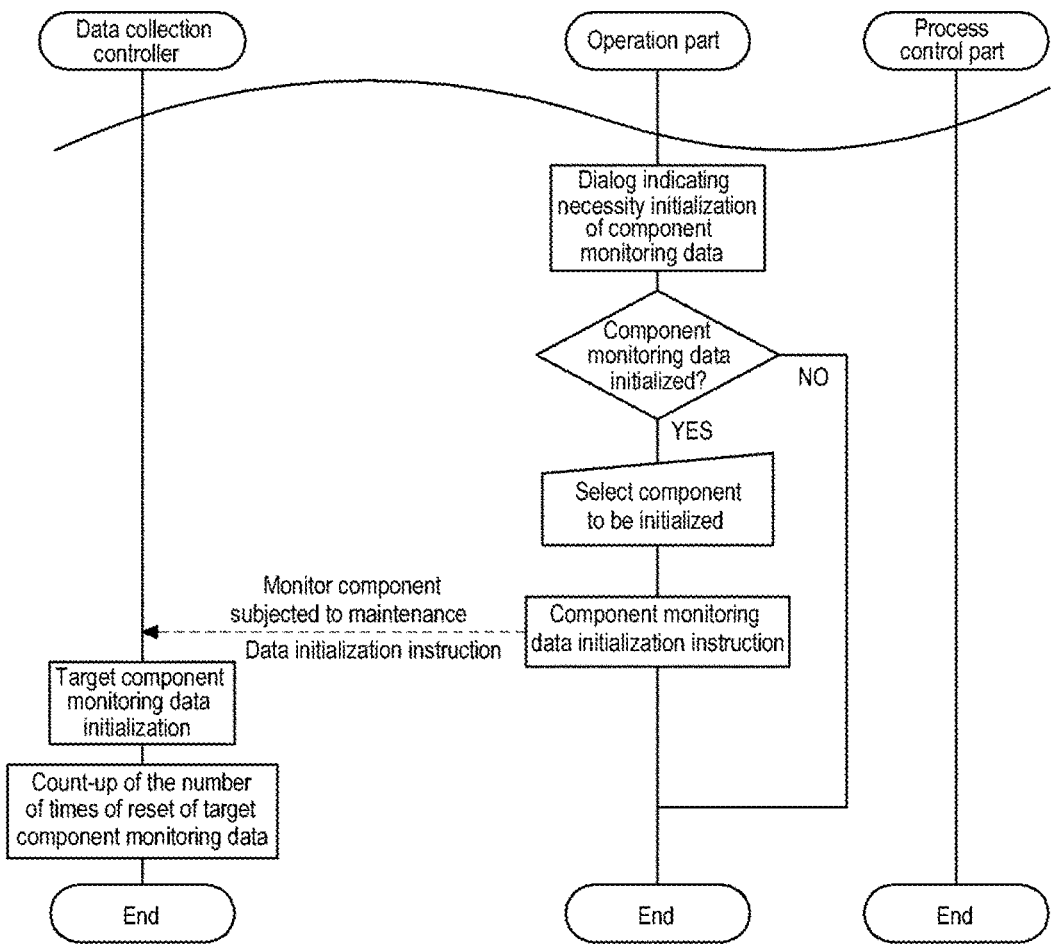
FIG. 6B is a view for explaining a processing flow of maintenance component management function suitably used in the substrate processing apparatus of the present disclosure.

FIGS. 6A and 6B are flowcharts for explaining a processing flow of the maintenance component management function of the substrate processing apparatus 1 in this embodiment.

The first half of the processing flow of the maintenance component management function will be described with reference to FIG. 6A. Device data are reported from, the process control part 212 to the operation part 201 at a certain period of time. The operation part 201 extracts component monitoring data from tire collected device data and reports the component monitoring data to the data collection controller 215 at a certain period of time, and the data collection controller 215 is configured to compare the collected component monitoring data with a threshold value set for each of the component monitoring data. When at least one of the component monitoring data in a monitoring item list screen (see FIG. 8) to be described later and the component monitoring data in a component management screen (see FIG. 9) to be described later exceeds this threshold value, the operation part 201 is notified (threshold over notification) that the information (threshold over information) indicating that the component monitoring data exceeds the threshold value. Then, the operation part 201 displays on the display part 218 warning information or alarm information indicating that the monitoring data of the maintenance component exceeds the threshold value. Here, when the component monitoring data in the monitoring item list screen (see FIG. 8) exceeds the threshold value, the operation part 201 may display a screen that urges an exchange work.

The operation part 201 is configured to refer to the device management data for management of the status of device stored in advance in the storage 222 and to determine whether or not a module composed of maintenance components whose monitoring data exceeds the threshold value is in a state where maintenance can be designated, such as a next operation execution standby state. If the state is at a condition that maintenance transfer is available, the maintenance designation is indicated. The process control part 212 is configured to receive the maintenance designation so as to transition the state of the corresponding module to the maintenance standby state, and to disable execution of the next operation.

In the maintenance transition displaying step, only a maintenance target module is designated for maintenance. This maintenance designation is indispensable especially for a device having a plurality of process modules. For example, with the maintenance designation, it is possible to separate the corresponding process module from the automatic operation and perform a degeneracy operation enabling the process to be continued by process modules other than the process module designated for maintenance.

After the maintenance designation, the maintenance is executed for the process module designated for maintenance. For example, when the cumulative film thickness of the process module is abnormal, a cleaning recipe is executed, or in the case of a vertical type apparatus, a recovery process such as replacement of the boat 20 is performed. After the recovery process, a predetermined setup procedure is performed and the maintenance is completed.

(Maintenance Cancellation Instruction)

After a device manager or a device engineer performs maintenance for a target module, a command to cancel the maintenance designation is issued from the operation screen of the operation part 201 to the process control part 212. For example, a command to cancel the maintenance designation is issued to the process control part 212 at a timing when the set-up of quartz of the process module is completed and a wafer can be processed, and the process control part 212, for example, changes the state of the target module to the next operation execution standby state, so that the process control part 212 changes the target module to be an available module.

Next, referring to FIG. 6B, first, after executing the maintenance cancellation designation, the operation part 201 prompts initialization or resetting by displaying a log indicating necessity of the initialization of the component monitoring data of the maintenance component. However, since the function of displacing this dialog box is not indispensable, it may be excluded from this flowchart. Incidentally, by displaying on the display part 218 a screen indicating necessity of the initialization of the component monitoring data, it goes without saying that an effect of preventing the initialization of the component monitoring data from being forgotten after maintenance can be expected.

(Initialization Step)

The operation part 201 is configured to display a screen for indicating the necessity of the initialization of the maintenance component monitoring data and determine whether or not the maintenance component monitoring data is initialized. If it is not necessary to initialize the maintenance component monitoring data, the flowchart is ended. If there is component monitoring data for which initialization is necessary, a target, component is selected and initialized. When the target component to be initialized is selected, the operation part 201 instructs the data collection controller 215 to initialize the component monitoring data of the maintenance component related to the module that the maintenance is performed.

The data collection controller 215 is configured to initialize the component monitoring data as a target to be initialized based on an instruction from the operation part 201. For example, when a monitor value of the component monitoring data as a target to be initialized is cleared to zero (sometimes also referred to as reset), a number of tunes of resetting is counted. With such a configuration, it is possible to prevent the initialization from being forgotten after the maintenance. In addition, the operation part 201 may receive an input of an operator from the display part 218 so that the monitor value of the component monitoring data can be cleared to zero. In this case, it is possible that the operation situation of components is more efficiently grasped from the viewpoint of monitoring the component lifetime. For example, in the present embodiment, the monitor value on the monitoring item data list screen in FIG. 8, to be described later, is configured so that the monitor value cannot, be zero-cleared on the component management program, but only a monitor value on the component management screen in FIG. 9, to be described later, can be zero-cleared.

Figure 7:
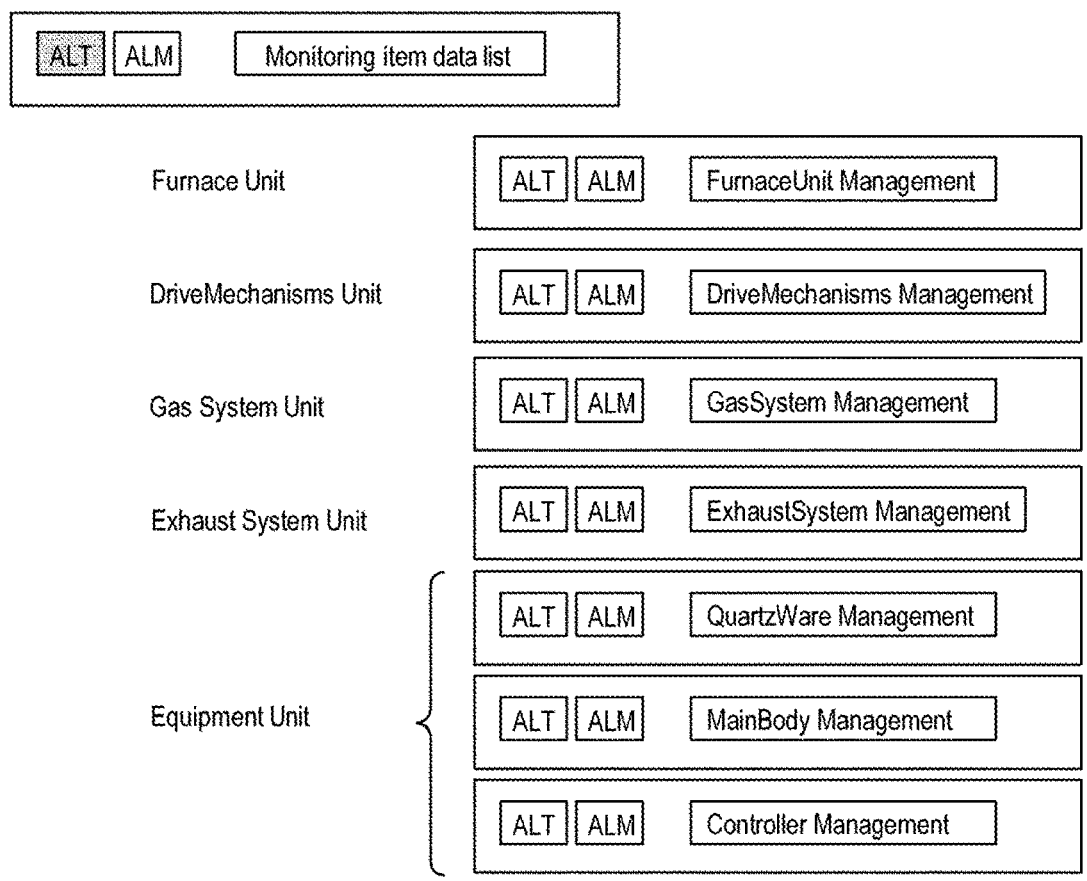
FIG. 7 is an illustrative example of a maintenance component management selection screen (vertical semiconductor manufacturing apparatus) according to one embodiment of the present disclosure.

Next, FIG. 7 will be described. FIG. 7 shows an example of a selection screen for selecting a screen for managing maintenance components.

When the data collection controller 215 executes the component management program, the maintenance component management selection screen shown in FIG. 7 is displayed. FIG. 7 shows at least a selection button for transition to the monitoring item data list screen concerning the maintenance components and a selection button for transition to the component management screen concerning each unit composed of maintenance components. In each selection button, "ALT" is configured to be explicitly indicated when an alert (warning) occurs in an arbitrary monitoring Item in each unit. Incidentally, FIG. 7 shows an example in which an alert occurs in a certain monitoring item on the monitoring item data list screen. Similarly, "ALM" is configured to be activated when an abnormality (alarm) occurs in an arbitrary monitoring item of each unit. In this manner, on the selection screen of FIG. 7, it is possible to grasp whether or not any abnormality has occurred in the maintenance components constituting the substrate processing apparatus 1.

Then, while the ALM is activated (for example, in red), each unit as a management area where the alarm occurs may be configured to be inoperable until the cause of the alarm is removed. For example, this is because stable operation cannot be guaranteed in a device including a unit in which an alarm alerting of the expiration of a component lifetime has occurred. Further, the screen of the component maintenance function (the maintenance component management selection screen shown in FIG. 7) may be displayed only when a special terminal is connected according to the operation method.

Next, an illustrative example of the monitoring item data list screen related to maintenance components will be described with reference to FIG. 8. Similarly to FIG. 7, FIG. 8 shows a monitoring item data list screen displayed by the data collection controller 215 executing the component management program. FIG. 8 is configured so as to be displayed when the monitoring item data list button in FIG. 7 is pressed. In the monitoring item data list screen, monitoring items selected as maintenance components in each unit are mainly displayed as a list. Monitor information displayed here may be referred to as lifetime information. The lifetime information may include setting information for setting a threshold value for notifying an alert or an alarm and the monitor information. As in FIG. 7, the monitoring item data list screen shown in FIG. 5 may be displayed only when a special terminal is connected.

The monitoring items shown in the monitoring item data list screen of FIG. 8 correspond to information which is the basic monitoring information for monitoring the monitoring value as component monitoring data such as a moving distance, use frequency, electric conduction time and the like of the maintenance components to be monitored. The lifetime information for the monitoring items is configured to be maintained without being initialized even at the time of exchange or maintenance of the components. A selection of the monitoring items to be monitored for the maintenance components constituting each unit, for example, a number of times of AV open and an MFC cumulative flow rate used in the Gas System component management screen to be described later, are monitoring targets which are narrowed as particularly significant items in the film forming process. In addition, these monitoring items are configured such that addition, deletion and the like can be arbitrarily made for each unit.

When the component monitoring data exceeds the threshold value designated in the setting information on the monitoring item data list screen of FIG. 8, the data collection controller 215 is configured to notify the operation unit 201 of an alert or an alarm. The flow of the component management program after the notification partially overlaps with the process described with, reference to FIG. 6 and therefore, only differences between the processes will be explained. According to a data initialization instruction from the operation part 201 for transition to the initialization process shown in FIG. 6, the data collection controller 215 initializes (i.e., zeroes) the component monitoring data (monitor value) in FIGS. 9A to 9G to be described later. Here, a target, to be initialized by the component management program shown in FIG. 6 is the component monitoring data of the component management screen shown in FIG. 9 (FIGS. 9A to 9G) to be described later.

In this case, a number of times of resetting is counted in FIGS. 9A to 9G to be described later, but the number of times of resetting on the monitoring item data list screen of FIG. 8 remains unchanged. In this way, the component monitoring data is configured as lifetime information (cumulative information) so as not to be initialized by the component management program even at the time of component exchange or maintenance. When the component monitoring data exceeds the threshold value designated in the setting information on the monitoring item data list screen in FIG. 8, the exchange of maintenance components are basically performed. This is because a set value (number of times, time, etc.) in consideration of the lifetime of each component is selected as the setting information on the monitoring item data list screen of FIG. 8 and it can be regarded that the maintenance component has reached the limit value at which the maintenance component part normally operates, i.e., has reached the component lifetime. Here, the setting information in FIG. 9 may be different even in case of the set related to the same maintenance component, such as when an exchange period of time can be extended by a recovery process such as a cleaning process for quartz components, a grease-up process on a transfer system, etc.

Here, a maintenance worker can perform a predetermined operation directly on the screen of FIG. 8 so that the monitor value or a number of times of reset which is monitor information can be updated. Because of this, the monitor value can be set to 0 only when the maintenance worker initializes on the screen. For example, when consumable components such as heaters, boats, etc. are exchanged for new ones, initialization can be performed. In this case, the maintenance worker can perform a process of returning the number of resets to 0 by a predetermined operation, like the monitor information. On the contrary, the maintenance worker may also add one to the number of resets. In addition, the number of resets on the screen of FIG. 9 cannot be returned to 0 unless the maintenance worker operates it.

Incidentally although the setting is formation may be also be modified appropriately, unless it is set to an appropriate set value (threshold value), an alert and an alarm may occur wastefully or, on the contrary, no alert and alarm occur even in a state in which it is necessary to exchange components, so that a possibility that this maintenance component management function has no meaning may be raised.

In addition, in order to at least store a monitor value as the monitoring item data, it may be configured to automatically convert it into a CSV file on a regular basis, for example, on a daily basis or monthly basis. For example, a file may not be immediately checked, such as by setting a file name as a date or a monitoring item name etc.

Next, the component management screen of each unit will be described in detail with reference to FIGS. 9A to 9G. Similarly to FIGS. 7 and 8, also with respect to FIG. 9 (FIGS. 9A to 9G), the data collection controller 215 executes the component management program to display each component management screen. Further, similar to FIGS. 7 and 8, display may be possible only when a special terminal is connected.

Further, as for the maintenance components displayed on the component management screen of each unit shown in FIG. 9 (FIGS. 9A to 9G), the maintenance components and details thereof are appropriately selected based on the monitoring item in FIG. 8. Then, each of the setting information for setting the threshold value of the maintenance components, the component monitoring data of the maintenance components, and the monitoring information including a number of resets obtained by initializing the maintenance components are displayed, as the component management information corresponding to this monitoring item, on each screen of FIG. 9.

Then, on the component management screen of each unit shown in FIG. 9 (FIGS. 9A to 9G), when the component monitoring data exceeds the threshold value designated in the setting information, the data collection controller 215 is configured to notify an alert or an alarm to the operation part 201. The flow of the component management program after the notification overlaps with that described with reference to FIG. 6 and therefore will be briefly described. According to a data initialization instruction from the operation part 201 for transition to the initialization process shown in FIG. 6, the data collection controller 215 initializes the component monitoring data (monitor value) displayed in FIG. 9 (FIGS. 9A to 9G) (i.e., sets the monitor value to 0). Further, referring to FIG. 6, a number of resets displayed in FIG. 9 (FIGS. 9A to 9G) is counted. Since the initialization and updating of the number of resets are basically the same in FIG. 9 (FIGS. 9A to 9G), they will be omitted in the description of each unit except supplementary explanation thereof as necessary.

FIG. 9A is an illustrative example of a component management screen, showing a Furnace Unit shown in FIGS. 7 and 8. In FIG. 9A, monitoring data of the maintenance components related to the furnace opening portion are displayed. Among the components constituting rite furnace opening portion, the components corresponding to the following items (1) to (4) are the targets of maintenance components. (1) The corresponding components are listed on the spare parts list. (2) Overhaul and/or maintenance by device maker engineers is/are necessary. (3) The corresponding components are important components for stable operation of the apparatus. (4) The corresponding components are expensive and it is necessary to contact a service base in advance before exchange.

In the present embodiment, this heater thermocouple is configured to be managed as a monitoring item by the ON time of the heater. Furthermore, the heater temperature history is configured to be set as a monitoring item, specifically, it is set so as to indicate a temperature zone at which the heater is being used at the time of heater ON. For example, when the temperature of the heater exceeds 800 degrees C., it significantly affects the lifetime (if the heater and therefore it is necessary to display a temperature zone at which the heater is used, in terms of management of maintenance components. For example, if the set value (for example, 10000H) of the ON time of the heater is initially set in low temperature film formation at a temperature of 400 degrees C., even if no alert (or alarm) occurs when the actual process is an annealing process is performed at a temperature of 800 degrees C. due to change in the specifications, it is possible to indicate the necessity for the maintenance worker to change the set value (10000H→5000H). In addition, even after changing the set value, since the original specifications have been changed, it is possible to provide a service such as suggesting changing the heater when there is an alert (warning). In FIG. 9A, only the heater thermocouple (T/C) is displayed as a maintenance component, but this is only one of example and it is natural that other thermocouples can be added as monitoring items.

In second-hand sales of semiconductor manufacturing apparatuses in recent years, it is possible to carry out optimal component exchange and maintenance for purchasers. For example, it is known that, when the heater is frequently used at an exceedingly high temperature (for example, 800 degrees C.), it significantly affects the lifetime of the heater. Therefore, by referring to the monitoring data of the heater of the second-hand device, in the case of frequent recorded high temperature usage, even if the elapsed time is not an exchange criterion, it is possible to exchange the heater for future stable operation.

FIG. 9B is an illustrative example of the component management screen showing Device Mechanism Units shown in FIGS. 7 and 8. This is a screen for monitoring maintenance components constituting a transfer mechanism including the pod transfer mechanism 15, the wafer transfer mechanism 24, the boat elevator 32 and the like, which are mechanisms for mainly transferring the substrate 18. In addition, in FIG. 9B, monitoring data of maintenance components related to a driving system including these transfer mechanisms are displayed. Among the components constituting the driving system, components corresponding to the following stems (1) to (4) are the targets of maintenance components, as in FIG. 9A. (1) The corresponding components are listed on the spare parts list. (2) Overhaul and/or maintenance by device maker engineers is/are necessary. (3) The corresponding components are important components for stable operation of the device. (4) The corresponding components are expensive and it is necessary to contact a service base in advance before exchange.

In FIG. 9B, units of No. 1 to No. 7 are units that operate with ON/OFF using Air N2. Each of the transfer mechanisms is managed by power ON time. Especially, the pod transfer mechanism 15, the wafer transfer mechanism 24 and the like are managed by a number of times of ON/OFF. This is because, in some cases, the apparatus may not be actually operated with the power ON time alone when the device is in an ON state. Further, units of No. 8 to No. 17 are units that operate by motor control. Similarly, since there is a time for which the transfer mechanism is not actually operated even at the time of power ON, each of the axes of the pod transfer mechanism 15, the wafer transfer mechanism 24 and the like is managed by not only the power ON time but also the moving distance. Because of this, although the present situation proposes maintenance for a period of six months or the like, a proposal of appropriate maintenance is expected, from the power ON time and the number of times of ON/OFF.

For example, when a monitoring item in FIG. 8 is a Z axis (No. 9), a maintenance component selected by the monitoring item (No. 9) in FIG. 8 is a monitoring item (No. 10: Z axis of transfer device) in FIG. 9B. If a content of maintenance includes greasing-up the Z axis of the transfer system, for example, the transfer device, a monitor value of the monitoring item (No. 10: Z axis of the transfer device) in FIG. 9B is cleared to zero and the number of resets is counted. However, the monitor value of the Z axis (No. 9) in FIG. 8 remains unchanged. Therefore, the number of resets is not counted. Here, supplementary explanation about greasing-up will be given. Greasing-up is a procedure to remove grease consumed or contaminated due to repeated operation and apply new grease to a drive shaft. Generally, greasing-up is carried out on a transfer device and a boat elevator of the transfer system once every three months, at which time component exchange is not typically performed. Incidentally, the setting information of the maintenance component (No. 10: Z axis of the transfer device) in FIG. 9B is set according to a period of time of greasing-up, and the monitoring item. (No. 9) in FIG. 8 is set in consideration of component lifetime. In this way, by making the setting information of maintenance timing for the same component different, efficient component management may be performed.

On the other hand, if the content of maintenance is changed, the monitor value of the monitoring item (No. 10: Z axis of the transfer device) in FIG. 9B is cleared to zero and a number of times of resetting is counted. In this case, since the relationship of the monitoring item in FIG. 8 and the maintenance component in FIG. 9 is 1:1 in the item of the Z axis of the transfer device, a monitor value of the monitoring Item (No. 9) in FIG. 8 is cleared to zero and the number of resets is also counted from an instruction of the operation part 201.

For example, if the monitoring item in FIG. 8 is a "transfer device" as an example, a maintenance component selected by the monitoring item (transfer device) in FIG. 8 are the monitoring items (No. 10: Z axis of transfer device. No. 11: Y axis of transfer device, No. 12: X axis of transfer device. No. 13: V axis of transfer device) in FIG. 9B. That is, this is an example of a case where a plurality of maintenance components in FIG. 9 is selected for one monitoring item in FIG. 8. In the same way as above, if the content of maintenance is greasing-up of the Z axis of the transfer device, the monitor value of the monitoring item (No. 10: Z axis of transfer device) in FIG. 9B is cleared to zero and the number of resets is counted. However, the monitor value of the transfer device of the monitoring item in FIG. 8 remains unchanged. In addition, if the content of maintenance is component exchange of the Z axis of the transfer device, the monitor value of the monitoring item (No. 10: Z axis of transfer device) in FIG. 9B is cleared to zero and the number of resets is counted. However, the monitor value of the transfer device of the monitoring item in FIG. 8 remains unchanged. Then, when the transfer device is exchanged for a new one as maintenance, the monitor value of the monitoring item in FIG. 8 and the monitor value of the maintenance component selected by the monitoring item in FIG. 9 are each cleared to zero and the number of times of reset is also counted.

In this manner, the operation on the monitoring item list screen (FIG. 8) after maintenance is different depending on the relationship between a monitoring item and a maintenance component selected by the monitoring item. Furthermore, since counting the number resets is also varied depending on the relationship between the monitoring item and the maintenance component selected by the monitoring item, in order to simplify the handling after the maintenance, the relationship between a monitoring items selected in FIG. 8 and a maintenance component selected by this monitoring item may be preferably 1:1.

FIG. 9C is an illustrative example of the component management screen showing a Gas System Unit shown in FIGS. 7 and 8. Monitoring data of maintenance components related to the gas supply system are mainly displayed. Among the components constituting the gas supply system, components corresponding to the following items (1) to (3) are the targets of maintenance components. (1) The corresponding components are listed on the spare parts list. (2) Overhaul and/or maintenance by device maker engineers are/is necessary. (3) The corresponding components are important components for stable operation of the device.

In FIG. 9C, an MFC (Mass Flow Controller) or a valve (AV) corresponds to a maintenance component. In addition to the MFC (or valve), other components (for example, a pipe heater installed to a pipe for supplying a gas into the furnace) may be added appropriately as necessary. Information related to maintenance of the maintenance component is displayed on this component management screen. Maintenance performance may be decided with a power ON time as monitoring items of the MFC and the valve. In addition, the maintenance timing may be determined with an integrated flow rate of the MFC and the number of times of opening the valve as monitoring items.

In particular, since many MFCs and valves are used in the apparatus, the relationship the monitoring item selected in FIG. 8 and the maintenance component selected by this monitoring item may be preferably 1:1. However, since it is numerous, it is not realistic to select all MFCs and valves as monitoring items. Thus, it is necessary to specify only a component placed in the important positions in the gas system related to film formation as a monitoring item. Because of this, it is possible to grasp the actual situation of the MFC so that an appropriate exchange time of the valve may be estimated.

FIG. 9D is an illustrative example of the component management screen showing an Exhaust System Unit illustrated in FIGS. 7 and 8. This is a screen for monitoring maintenance components mainly constituting an exhaust mechanism including an APC (Auto Pressure Controller) valve and the like as monitoring items. In addition, in FIG. 9D, monitoring data of maintenance components related to this exhaust system are displayed. Among the components constituting the exhaust system, components corresponding to the following items (1) to (4) are the objects of maintenance components, as in FIG. 9A, (1) The corresponding components are listed on the spare parts list. (2) Overhaul and/or maintenance by device maker engineers are/is necessary. (3) The corresponding components are important components for stable operation of the device. (4) The corresponding components are expensive and it is necessary to contact a service base in advance before exchange.

In FIG. 9D, valves (AV) (No. 4 to No. 6) including the APC valve, vacuum device systems (No. 1 to No. 3) including a dry pump and a mechanical booster pump, and pressure sensors (No. 7 to No. 9) corresponds to maintenance components. In addition to the MFC (or valve), other components (for example, a pipe heater installed in a pipe for supplying a gas into the furnace) may be added appropriately as necessary.

In addition, in FIG. 9D, as for the valves (AV) including the APC valve, similarly to the above-described valve in the gas supply system of FIG. 9C, the maintenance timing of the valves (AV) may be determined with a number of times of opening the valves (AV) as well as the device power ON time. In substantially the same manner, the maintenance timing of the pump system may be determined with, not only the power ON time but also a cumulative film thickness.

FIGS. 9E to 9G are illustrative examples of the component management screen showing an Equipment Unit shown in FIGS. 7 and 8. FIG. 9E is a screen for monitoring maintenance components related to an on-board controller. FIG. 9F is a screen for monitoring maintenance components constituting a housing of the apparatus. FIG. 9G is a screen for monitoring maintenance components related to quartz components. Among the components related to the on-board controller shown in FIG. 9E, components corresponding to the following items (1) to (3) are the targets of maintenance components as in FIG. 9A. (1) The corresponding components are listed on the spare parts list. (2) The corresponding components are important components for stable operation of the device. (3) The corresponding components are expensive and it is necessary to contact a service base in advance before exchange.

In addition, of the components constituting the housing of the apparatus, shown in FIG. 9F and the quartz components shown in FIG. 9G, components corresponding to the following items (1) to (4) are the targets of maintenance components. (1) The corresponding components are listed on the spare parts list. (2) Overhaul and/or maintenance by device maker engineers are/is necessary. (3) The corresponding components are important components for stable operation of the device. (4) The corresponding components are expensive and it is necessary to contact a service base in advance before exchange.

In FIG. 9E, monitoring data of maintenance components related to the on-board controller are displayed. In FIG. 9F, monitoring data of maintenance components related to the device housing are displaced. In FIG. 9G, monitoring data of maintenance components related to the quartz components are displayed.

In FIG. 9E, the controller as a maintenance component is monitored with the device power ON time as a monitoring item. In FIG. 9F, a clean unit as a maintenance component is monitored with the device elapsed time of a filter as a monitoring item.

In particular, in FIG. 9G, each quartz component as a maintenance component is monitored with not only the device power ON time but also a cumulative film thickness value as monitoring items. In addition, the quartz component is monitored with a history of how long it was exposed and what temperature zone (processing temperature) it was exposed during substrate processing, as a monitoring item.

Specifically, in FIG. 9G, the quartz components are managed with the cumulative film thickness value. Further, as the heater temperature history management, when the heater is in an ON state, a temperature range at which the heater is being used is displayed. For example, when the temperature of the heater exceeds 800 degrees C., it significantly affects the lifetime of the heater and therefore it is necessary to display a temperature zone at which the heater is used, in terms of management of maintenance components. For example, in a case where the set value (for example, 1000 nm) of the accumulative film thickness is set in low temperature film formation, at a temperature of 400 degrees C., even if no alert (or alarm) occurs when the actual process is an annealing process is performed at a temperature of 800 degrees C. due to change in the specifications, it is possible to indicate necessity of the maintenance worker to change the set value (1000 nm→500 nm). In addition, even after changing the set value, since the original specifications have been changed, it is possible to provide a service such as suggesting a maker to exchange the heater at the point of time of alert (warning).

In this way, according to the present embodiment, by referring to the monitoring item list screen shown in FIG. 8 and the monitoring item data of the maintenance component on the maintenance component management selection screen shown in FIGS. 9A to 9G, a maintenance component that has reached a limit recommended for maintenance or exchange can be picked up and proposed for a service.

First, an error (or alert) that has occurred in a maintenance component is grasped on the maintenance component management selection screen, shown in FIG. 7. For example, when an alarm occurs in GasSystem management, since the GasSystem management corresponds to a button in FIG. 7, by pressing this button, this selection screen is transited to the maintenance component management screen (GasSystem management) in FIG. 9 to check details of the alarm. Here, since the number of times of using the valve (AV) is large, proposals for exchange work, etc. can be made as maintenance while watching the screen.

In addition, an error (or alert) that has occurred in a maintenance component is grasped on the maintenance component, management selection screen shown in FIG. 7. For example, when an alarm occurs in a DeviceMechanisms Unit management, since the DeviceMechanisms management corresponds to a button in FIG. 7, by pressing this button, this selection screen is transited to the maintenance component management screen (DeviceMechanisms Unit management) in FIG. 9 to check details of the alarm. For example, because an alarm occurs for units other than the transfer device repaired this time, it is possible to propose a service. In addition, it is possible to reset the monitor value of the transfer device maintained this time.

FIG. 11 shows the relationship between the moving distance of a transfer device (X axis) of a vertical apparatus and date/time (hour). From this relationship, it possible to compare the moving distance of the transfer device (X axis) of the vertical apparatus with an overhaul threshold value and determine an appropriate maintenance timing while watching the tendency of the moving distance on the screen.

The data collection controller 215 is configured to graphically display a moving distance integrated value of the X axis (X axis of transfer device) of the wafer transfer mechanism 24, as shown in FIG. 11. Because of this, as shown in FIG. 11, it is possible to compare the cumulative value of the moving distance a scheduled overhaul recommendation date, and a scheduled overhaul recommendation date based on the elapsed time after the maintenance. It is necessary for the transfer device (the wafer transfer mechanism 24) of the vertical apparatus to perform overhauling periodically. Conventionally, because the moving distance data of the axis of the transfer device cannot be obtained, overhauling is performed based on an elapsed date/time. On the other hand, in the present embodiment, it is possible to predict the optimal scheduled overhaul date by acquiring the moving distance data of the X axis of the transfer devices of this maintenance component management function. Furthermore, by overlapping the scheduled date recommended with the past elapsed days on the graph, it is possible to recognize the date/time arriving earlier as a scheduled overhaul date.

Since a service department (or service company) of a semiconductor manufacturing apparatus maker exchanges overhauls of the actual transfer device for each transfer device unit in order to shorten the stoppage period of device operation, it is possible to request the service department (or service company) to prepare for overhaul in advance.

Figure 12:
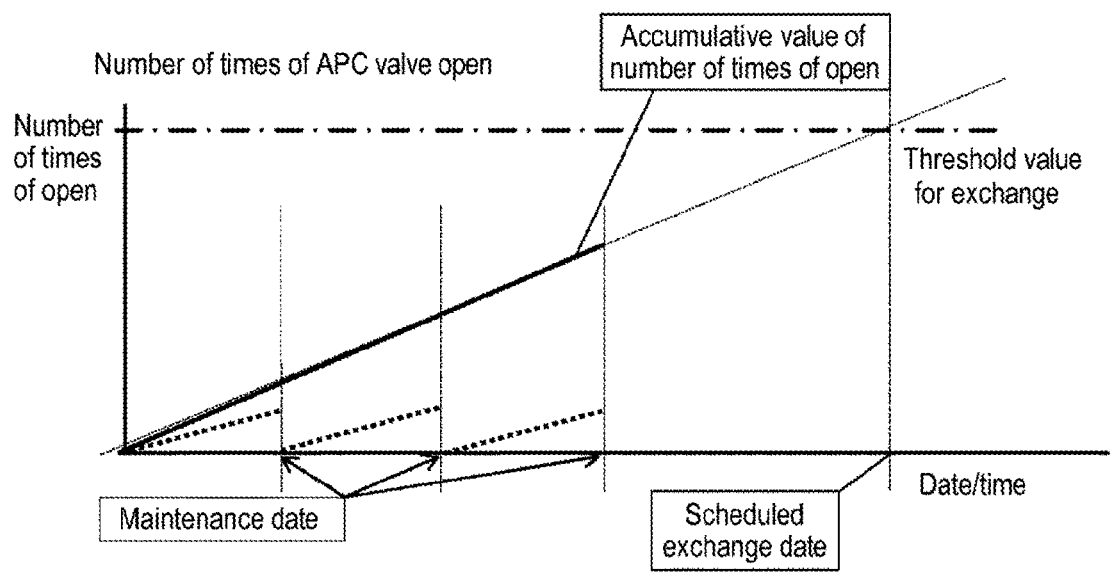
FIG. 12 is an illustrative example for explaining maintenance component management (graphics of monitoring data) according to an embodiment of the present disclosure.

Further, by predicting the exchange timing from a number of times of opening the APC valve as shown in FIG. 12, it is possible to order a component or reserve exchange in advance to the service department (or service company) of the device maker. The APC valves used in the exhaust system are configured to perform maintenance together at the timing of cleaning and exchange of quartz components.

Up to now, when maintenance is performed, since the number of times is cleared to zero, it is not possible to set the maintenance timing with the number of times of opening. However, since the number of times of opening can be specified as the criterion of exchange, it is possible to predict the scheduled exchange date by holding a cumulative value of the number of times of opening as monitoring item data.

Up to now, since component exchange and maintenance are set with the elapsed time alter device operation, there was a problem that the component exchange and maintenance could not be determined by numerical values based on the operation situation of the components such as an axis moving distance. In the present embodiment, the device manager grasps a management area having a component whose monitoring data exceeds a threshold value, by referring to the main screen (FIG. 7) of the maintenance component management function of the data collection controller. A unit composed of maintenance components whose monitoring data exceed the threshold value is checked by touching a button of the management area, in this manner, by referring to the main screen of maintenance component management, the device manager can determine exchange and maintenance while watching specific numerical values taking account of the operation situation of the device in addition to the elapsed time.

In addition, in the present embodiment, a service engineer of the device maker can respond to the failure of the semiconductor manufacturing apparatus installed in the device maker such as responding to the failure of device components. For example, after performing the responding to the failure, it is possible to propose future device maintenance services by referring to the monitoring data of maintenance components to display a graph showing a tendency of storage of monitoring data. In addition, if a maintenance contract is made, it is possible to propose a maintenance service that can contribute to more stable device operation by obtaining cumulative values of device operation situations or monitoring data from the device maker. In addition, it is possible to plan to optimize a stock by preparing systematically only maintenance components close to an exchange limit. In addition, it is possible to make a proposal to reduce the number of times of apparatus stoppage by collectively operating maintenance-components close to scheduled exchange or maintenance date.

(Other Embodiments)

Figure 13:
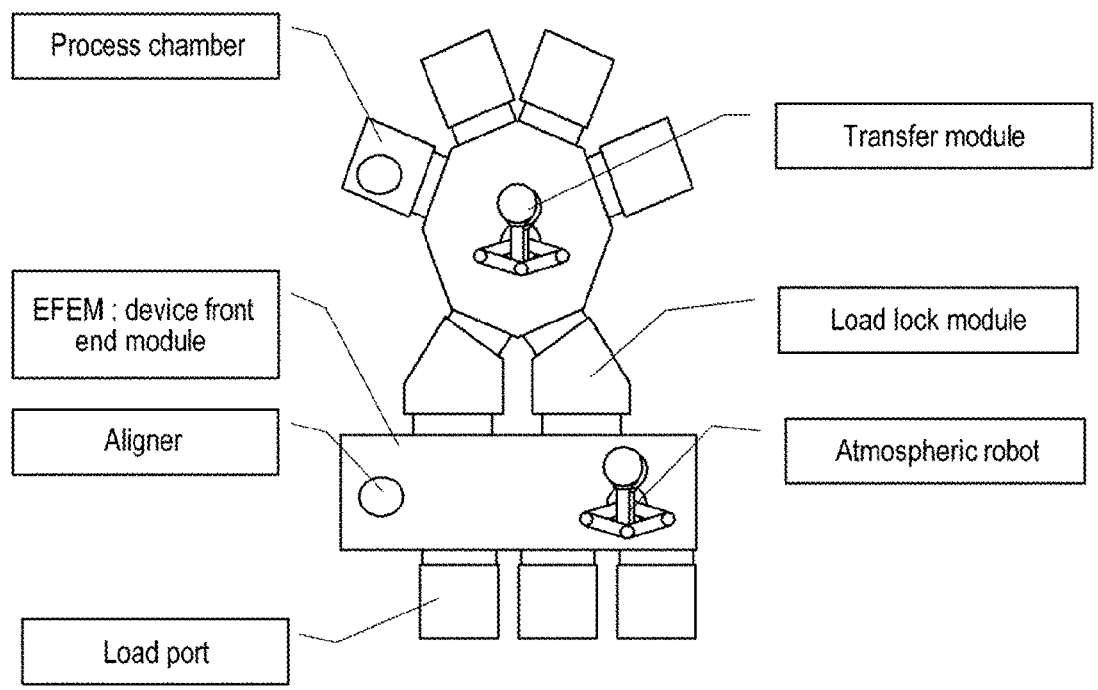
FIG. 13 is a sectional view showing a schematic device configuration (a single wafer semiconductor manufacturing apparatus) suitably used in another embodiment of the present disclosure.

Next, another embodiment of the present disclosure will be described with reference to the drawings. The present disclosure can also be applied to a substrate processing apparatus 1 as a cluster type single wafer semiconductor manufacturing apparatus shown in FIG. 13. As shown in FIG. 13, the substrate processing apparatus 1 according to another embodiment of the present disclosure is a cluster type single wafer semiconductor manufacturing apparatus including a process chamber (PM) as a processing chamber for processing a substrate, a transfer module (TM) as a transfer chamber having a vacuum robot (not shown) for transferring the substrate in a state of reduced pressure, a load lock module (LM) as a preliminary chamber for holding the substrate until atmospheric pressure or the reduced pressure is stabilized, an equipment front end module (EFEM) as an atmospheric transfer chamber having an atmospheric robot for transferring the substrate at the atmospheric pressure, and a load port (LP) as a carrier delivery in which the substrate is accommodated.

The single wafer semiconductor manufacturing apparatus has the controller configuration obviously different in that the number of process modules (PM) as processing chambers for processing the substrate is increased, but there is not much difference other than that point and therefore, explanation of which will not be repeated.

Figure 14:
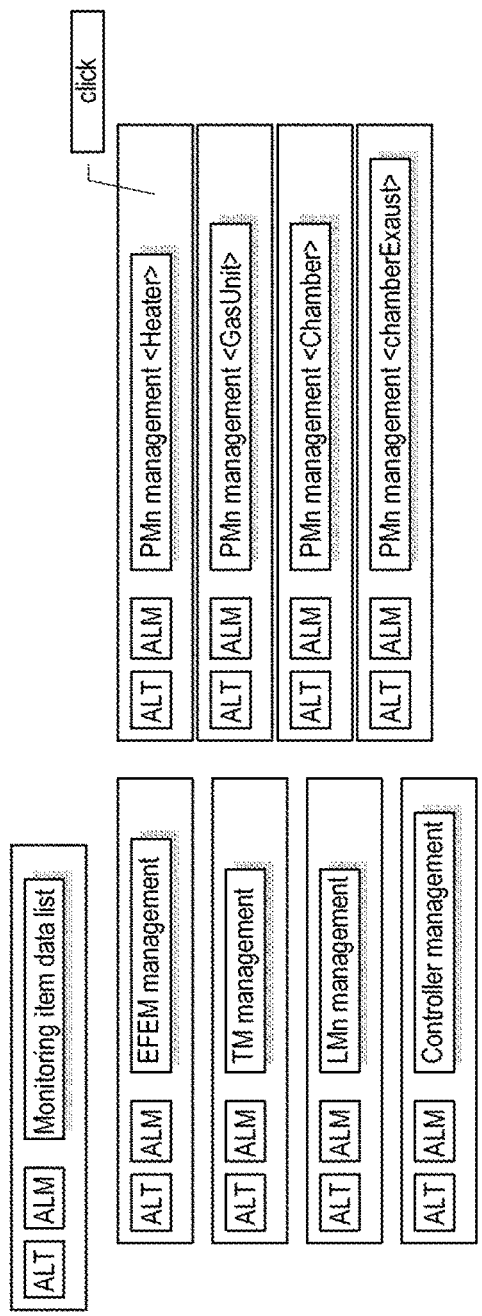
FIG. 14 is an illustrative example of a maintenance component management selection screen (single wafer semiconductor manufacturing apparatus) according to one embodiment of the present disclosure.

FIG. 14 shows a maintenance component management selection screen when the present disclosure is applied to a cluster type single wafer semiconductor manufacturing apparatus, and FIG. 15 shows a monitoring item data list screen. Here, differences from the case where the present disclosure is applied to the vertical substrate processing apparatus 1 will be mainly described, and explanation about overlapping portions thereof will be omitted.

Among the monitored items shown in FIG. 1-4, a unit having a difference depending on a difference in configuration between the vertical apparatus and the single wafer apparatus will be described with reference to FIG. 15 and the subsequent figures. Further, when an alert and an alarm occur within each monitoring item, an ALT icon or an ALM icon is clearly indicated. For example, if it is an alert, the ALT icon is displayed in yellow and if it is an alarm, the ALM icon is displayed in red. In addition, in order to confirm details of the alert and the alarm, the respective monitoring items have respective buttons and it is possible to transit to the component management screen by pressing these buttons.

In addition, among the components constituting the substrate processing apparatus in FIGS. 15 to 20, the components corresponding to the following items (1) to (4) are the targets of maintenance components. (1) The corresponding components are listed on the spare parts list. (2) Overhaul and/or maintenance by device maker engineers are/is necessary. (3) The corresponding components are important components for stable operation of the device (4) The corresponding components are expensive and it is necessary to contact a service base in advance before exchange.

FIG. 15 shows the monitoring item data list screen. This screen includes items indicating EFEM management, LM management, TM management, PM management, etc. These selected monitoring data are examples. Equipment is monitoring data contributing to the entire device (or equipment). Also in this embodiment, the maintenance components selected according to the monitoring items of FIG. 15 are configured to be managed on the component management screens of FIGS. 16 to 20, respectively.

FIG. 16 shows an illustrative example of the component management screen when the EFEM management is pressed. In FIG. 16, monitoring data of maintenance components related to FOUP or the like on the load port is mainly displayed. Here, the maintenance timing of the FOUP can be determined with not only the device power ON time but also a number of times of opening or the number of times of mapping.

FIG. 17 shows an Illustrative example of the component management screen when the LM management is pressed. In FIG. 17, monitoring data of maintenance components related to components constituting the LM is mainly displayed. Here, the maintenance timing of a gate valve can be determined with not only the device power ON time but also a number of times of opening.

FIG. 18 shows an illustrative example of the component management screen, when the TM management is pressed. In FIG. 18, monitoring data of maintenance components related to components constituting the TM are mainly displayed. Here, as a monitoring item, the maintenance timing of the gate valve can be determined with not only the device power ON time but also a number of times of opening. In addition, as a monitoring item, the maintenance timing of a vacuum robot TH disposed in the TM can be determined with not only the device power ON time but also a moving distance of the vacuum robot.

FIG. 19 shows an illustrative example of the component management screen when the PM (Heater) management is pressed. In FIG. 19, monitoring data of maintenance components related to the heater of the process module (PM) is mainly displayed. Here, the heater is determined with the heater ON time as a monitoring item. In addition, a mechanism for moving up/down the heater is determined with not only the device power ON time but also a heater position ascending/descending distance as monitoring items.

FIG. 20 shows an illustrative example of the component management screen when the PM (Chamber) management is pressed. In FIG. 20, monitoring data of maintenance components related to the processing chamber of the process module (PM) is mainly displayed. As a monitoring item, the maintenance timing of components, constituting the chamber can be determined with not only the de vice power ON time but also a number of times of film formation. As a monitoring item, the maintenance timing of a lamp can be determined with the lamp ON time and the number of times the lamp is in the ON state. Furthermore, the maintenance timing of an RF power supply can be determined with RF application time as a monitoring item.

Further, on the monitoring item data list screen shown in FIG. 15, the maintenance component management screens related ControllerBox management, PM (GasUnit) management and PM (ChamberExhaust) management have substantially the same configuration and items or monitoring data as the maintenance component management screens respectively corresponding to Controller management, GasSystem management, and ExhaustSystem management in the vertical apparatus, respectively, and therefore, explanation of which will not be repeated.

In the present embodiment, since units constituted by target maintenance components differ depending on a difference in configuration between the vertical device and the single wafer device, only the monitoring items of the maintenance components are different as described above but the technical idea of the present disclosure is the same.

Accordingly, in the present embodiment, it goes without saying that the same effect of achieving the stable operation of the substrate processing apparatus and the reduction of lot-out ratio by grasping the maintenance timing of the component components of the substrate processing apparatus can be produced irrespective of whether the substrate processing apparatus is a vertical apparatus or a single wafer apparatus.

Thus, each embodiment (the present embodiment) of the present disclosure has at least one of the following effects (a) to (k).

(a) According to the present embodiment, since it is possible to hold the monitoring information for monitoring the moving distance, the use frequency, the electric conduction time and the like of the maintenance components and the number of times of reset by which the monitoring information of the maintenance components after maintenance are initialized, it is possible to achieve more stable operation of the apparatus and to reduce the lot-out ratio by grasping the recommended maintenance tinting before failure of the maintenance components. In addition, by referring to the number of times by which the monitoring information of the maintenance components is initialized, it is possible to grasp the number of times of component exchange and maintenance to know the nature (e.g., easiness of calibration deviation) unique to the components and the exchange criterion based on the number of times of maintenance.

(b) Particularly, since the vertical semiconductor manufacturing apparatus loads and processes up to 200 wafers of diameter of 300 mm in the processing furnace, if an abnormality occurs during the process, a loss becomes high when lot-out. According to the present embodiment, by disabling a module and a transfer mechanism constituted by the target maintenance components in a maintenance standby state, it is possible to prevent losses of the recovery time of wafers, the engineer's recovery man-hours and the stoppage time of the vertical apparatus after failure occurrence in advance to prevent the next operation execution from being performed during the current operation.

(c) According to the present embodiment, since it is possible to hold the monitoring information for monitoring the moving distance, the use frequency, the electric conduction time and the like of the maintenance components and the number of times of reset by which the monitoring information of the maintenance components after maintenance are initialized, in a case of a maintenance component having an exchange period of time after performance of plural maintenances, it can be left as a monitor value which is not initialized at the timing of maintenance and it is possible to use the monitor value divisionally according to both the maintenance period of time and the component exchange period of time.

(d) In addition, a case where semiconductor manufacturing apparatuses are used for resale is becoming common. According to the present embodiment, since fee information of the monitoring items remains as the common lifetime information of the semiconductor manufacturing apparatus system, it is possible to appropriately cope with second hand semiconductor manufacturing apparatuses, such as minimizing the maintenance costs limited as necessary or exchanging components earlier in consideration of the future use situation, based on information retaining component exchange and maintenance necessary for restarting the devices.

(e) According to the present embodiment, since the operator can initialize components at the end of maintenance without forgetting, the target maintenance component information is correctly initialized at the time of exchange, adjustment and maintenance, so that accurate maintenance component management can be operated.

(f) Typically, when an engineer performs maintenance of maintenance components, a command to designate maintenance for a target module or transfer mechanism is set in the apparatus and the target module is designated as a state of being maintainable. According to the present embodiment, a dialog is displayed to indicate necessity of the initialization of the monitoring data of the maintenance component function, and the monitoring data of the maintenance components is automatically transited to the component maintenance screen of the target module or the monitoring data of the maintenance components related to the target module is automatically initialized. Therefore, when returning the device to a producible module after completion of the maintenance work, it is possible to reliably cancel the maintenance designation.

(g) According to the present embodiment, it is possible to graphically display the monitoring information of the maintenance components on the time axis, so that it is possible to predict, the maintenance timing from a tendency of increase in the monitor values of components to be monitored on an operation screen, thereby making it possible to prepare maintenance components in advance.

(h) According to the present embodiment, it is possible to contribute to stable operation of the substrate processing apparatus by performing an analysis carrying unique information and stored data of the semiconductor manufacturing apparatus.

(i) Conventionally, since component exchange and maintenance are set with the elapsed time after device operation, there was a problem that the component exchange and maintenance cannot be determined by numerical values based on the operation situation of the components such as an axis moving distance. However, according to the present embodiment, advice manager of the device maker grasps a management area having components whose monitoring data exceeds a threshold value by referring to the main screen of the maintenance component management. A maintenance component unit whose monitoring data exceed the threshold value is checked by touching a button of the management area. In this manner, device manager of the device maker can refer to the main screen of maintenance component management to determine exchange and maintenance while watching specific numerical values taking account of the operation situation of the apparatus in addition to the elapsed time.

(j) According to the present embodiment, a service engineer of the device maker responds to the failure of the semiconductor manufacturing apparatus installed in the device maker such as responding to the failure are of device components. For example, after performing the responding to the failure, it is possible to propose future apparatus maintenance services by referring to the monitoring data of maintenance components to display a graph showing a tendency of storage of monitoring data. In addition, if a maintenance contract is made, it is possible to propose a maintenance service that can contribute to more stable apparatus operation by obtaining apparatus operation situations and cumulative values of monitoring data from the device maker. In addition, it is possible to optimize a stock by preparing only maintenance components close to an exchange limit systematically. In addition, it is possible to make a proposal to reduce the number of times of apparatus stoppage by collectively operating maintenance components close to scheduled exchange or maintenance date.

(k) According to the present embodiment, in second-hand sales of semiconductor Manufacturing apparatuses in recent years, it is possible to carry out optimal component exchange and maintenance for purchasers. For example, it is known that, when a heater is frequently used exceeding a temperature which is in a high temperature range, it significantly affects the lifetime of the heater. Therefore, by referring to the monitoring data of the beater of the second-hand device, in a case where the usage record at a high temperature is frequent, even if the elapsed time is not an exchange criterion, it is possible to exchange the heater for the future stable operation.

It should be noted that the substrate processing apparatus 1 according to the embodiments of the present disclosure can be applied not only to semiconductor manufacturing apparatuses for manufacturing semiconductor apparatuses but also devices for processing glass substrates such as LCD devices. Of course, the substrate processing apparatus 1 according to the embodiments of the present disclosure can be applied to various different substrate processing apparatuses such as exposure apparatuses, lithography apparatuses, coating apparatuses, plasma processing apparatuses and the like.

Further, the flint forming process of the present disclosure may include a process of forming a thin tints such as CVD or PVD, a process of forming an oxide film or a nitride film, or a process of forming a metal-containing film.

The present disclosure can be applied to management of components constituting a substrate processing apparatus for processing a substrate.

According to the present disclosure in some embodiments, it is possible to provide a stable operation of a substrate processing apparatus by grasping the maintenance timing of components constituting a substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a main controller configured to acquire device data from a monitoring target, wherein the monitoring target includes a maintenance component; and
a data collection controller configured to hold monitoring item list information and component management information,
wherein the monitoring item list information is configured to hold:
monitoring item information indicative of a monitoring item for monitoring the maintenance component;
first setting information for setting a first threshold value for the monitoring item; and
first monitoring information including first monitoring data for the monitoring item and a first number of times of resetting by which the first monitoring data is initialized,
wherein the component management information is configured to hold:
second setting information for setting a second threshold value for the monitoring item; and
second monitoring information including second monitoring data for the monitoring item and a second number of times of resetting by which the second monitoring data is initialized,
wherein the data collection controller is further configured to update the first monitoring data and the second monitoring data based on the device data acquired by the main controller,
wherein the data collection controller is further configured to provide the main controller with:
a first notification that the first monitoring data has reached the first threshold value; and
a second notification that the second monitoring data has reached the second threshold value,
wherein the main controller is further configured to provide the data collection controller with:
a first instruction for initializing the first monitoring data and the second monitoring data after maintenance according to the first notification; and
a second instruction for initializing the second monitoring data after maintenance according to the second notification, and
wherein the data collection controller is further configured to:
in response to the first instruction, initialize the first monitoring data and the second monitoring data, and increment a count of the first number of times of resetting and the second number of times of resetting; and
in response to the second instruction, initialize the second monitoring data, and increment a count of the second number of times of resetting.

2. The substrate processing apparatus of claim 1, further comprising:
a control part configured to report the device data to the main controller at a predetermined period of time; and
a storage part configured to store device management data for managing a state of the maintenance component as the monitoring target, and a state of open/close of valves related to the maintenance component,
wherein the main controller is configured to, if the state of the monitoring target is in a standby state for a next operation execution by referring to the storage part at a timing at which the first monitoring data has reached to the first threshold value or a timing at which the second monitoring data has reached to the second threshold value, instruct the control part to designate maintenance, and
wherein the control part is further configured to change the state of the monitoring target to a maintenance standby state to prevent the next operation execution from being performed.

3. The substrate processing apparatus of claim 2, wherein the main controller is further configured to prevent the control part from being instructed to designate maintenance when the monitoring target is in operation.

4. The substrate processing apparatus of claim 1, wherein the main controller includes a display part configured to display graphically the first monitoring data, and
wherein the data collection controller is further configured to display values of the first monitoring data of the maintenance component on the display part as a time basis.

5. The substrate processing apparatus of claim 4, wherein the main controller is further configured to display a screen that indicates necessity of initialization of the first monitoring data on the display part after the maintenance is performed.

6. The substrate processing apparatus of claim 1, wherein initialization of the first monitoring data and the second monitoring data of the component management information and the monitoring item list information and counting the first number of times of resetting and the second number of times of resetting are determined to be performed according to a relationship between the monitoring item and the maintenance component selected by the monitoring item.

7. The substrate processing apparatus of claim 1, wherein the monitoring item list information is basic information of the component management information.

8. The substrate processing apparatus of claim 1, wherein the maintenance component set in the component management information is selected based on the monitoring item information of the monitoring item list information.

9. The substrate processing apparatus of claim 1, wherein the first setting information set in the monitoring item list information and the second setting information set in the component management information are configured to be different from each other.

10. The substrate processing apparatus of claim 1, wherein the main controller is further configured to notify necessity of an exchange work for the maintenance when the first monitoring data of the monitoring item list information reaches the first threshold value.

11. The substrate processing apparatus of claim 1, further comprising a control part configured to report the device data to the main controller at a predetermined period of time,
   wherein the main controller includes a display part configured to display graphically the first monitoring data, and
   wherein the main controller is further configured to display a screen that indicates necessity of initialization of the first monitoring data on the display part after instructing the control part to cancel maintenance designation.

12. A non-transitory computer-readable recording medium storing a component management program that causes a computer to perform a process in a substrate processing apparatus including:
   a main controller configured to acquire device data from a unit that is a part of the substrate processing apparatus and includes a maintenance component selected as a monitoring target; and
   a data collection part configured to hold monitoring item list information and component management information,
   wherein the monitoring item list information is configured to hold:
      monitoring item information indicative of a monitoring item for monitoring the maintenance component;
      first setting information for setting a first threshold value for the monitoring item; and
      first monitoring information including first monitoring data for the monitoring item and a first number of times of resetting by which the first monitoring data is initialized,
   wherein the component management information is configured to hold
      second setting information for setting a second threshold value for the monitoring item; and
      second monitoring information including second monitoring data for the monitoring item and a second number of times of resetting by which the second monitoring data is initialized,
   the process comprising:
   updating, by the data collection part, the first monitoring data and the second monitoring data based on the device data acquired by the main controller;
   providing, by the data collection part, the main controller with:
      a first notification that the first monitoring data has reached the first threshold value; and
      a second notification that the second monitoring data has reached the second threshold value;
   providing, by the main controller, the data collection part with:
      a first instruction for initializing the first monitoring data and the second monitoring data after maintenance according to the first notification; and
      a second instruction for initializing the second monitoring data after maintenance according to the second notification, and
   in response to the first instruction, initializing, by the data collection part, the first monitoring data and the second monitoring data, and incrementing a counter of the first number of times of resetting and the second number of times of resetting; and
   in response to the second instruction, initializing, by the data collection part, the second monitoring data, and incrementing a counter of the second number of times of resetting.

* * * * *